United States Patent [19]

Hamano et al.

[11] Patent Number: 5,510,745
[45] Date of Patent: Apr. 23, 1996

[54] HIGH-SPEED ELECTRONIC CIRCUIT HAVING A CASCODE CONFIGURATION

[75] Inventors: Hiroshi Hamano, Kawasaki; Izumi Amemiya, Yokohama; Takuji Yamamoto, Kawasaki; Hiroo Kitasagami, Kawasaki; Takeshi Ihara, Kawasaki, all of Japan

[73] Assignee: Fujitsu Limited, Kawasaki, Japan

[21] Appl. No.: 170,997

[22] Filed: Dec. 21, 1993

Related U.S. Application Data

[63] Continuation of Ser. No. 80,136, Jun. 23, 1993, abandoned, which is a continuation of Ser. No. 874,212, Apr. 27, 1992, abandoned, which is a continuation of Ser. No. 339,384, Mar. 28, 1989, abandoned.

[30] Foreign Application Priority Data

| Jul. 29, 1987 | [JP] | Japan | 62-189848 |
| Jul. 29, 1987 | [JP] | Japan | 62-189849 |
| Jul. 29, 1987 | [JP] | Japan | 62-189850 |
| Jul. 29, 1987 | [JP] | Japan | 62-189851 |
| Jul. 30, 1987 | [JP] | Japan | 62-191040 |
| Sep. 16, 1987 | [JP] | Japan | 62-231818 |

[51] Int. Cl.⁶ ............................................. H03K 19/082
[52] U.S. Cl. ........................ 327/333; 327/355; 327/356; 327/65
[58] Field of Search .................................... 307/494, 496, 307/264, 352, 475, 257, 558; 330/252, 253; 327/333, 105, 355, 356, 359, 361, 65, 563

[56] References Cited

U.S. PATENT DOCUMENTS

| 3,200,343 | 8/1965 | Skinner | 330/311 |
| 3,283,170 | 11/1966 | Buie | |
| 3,496,385 | 2/1970 | Hopkins | 307/254 |
| 3,516,003 | 6/1970 | Boone | |

(List continued on next page.)

FOREIGN PATENT DOCUMENTS

| 0031226 | 7/1981 | European Pat. Off. | G11C 8/00 |
| 0093996 | 11/1983 | European Pat. Off. | H03K 19/092 |
| 0121027 | 10/1984 | European Pat. Off. | H03F 3/45 |
| 0144647 | 6/1985 | European Pat. Off. | H03F 3/45 |
| 0148395 | 7/1985 | European Pat. Off. | H04Q 3/52 |

(List continued on next page.)

OTHER PUBLICATIONS

Electronique Applications, No. 44, Oct./Nov. 1985, H. Schreiber: "Le montage 'cascode desadapte'", pp. 49–51.

IBM Technical Disclosure Bulletin, vol. 23, No. 1, Jun. 1980, V. S. Moore et al.: "Differential Amplifier Gain–Bandwidth Circuit with a Differentially Driven Mode", pp. 48–49.

IBM Technical Disclosure Bulletin, vol. 20, No. 7, Dec. 1977, L. W. Brown et al.: "Interconnection of Logic Circuits", pp. 2537–2540.

The General Radio Experimenter, vol. 42, No. 10, Oct. 1968, Concord, "How it Works", p. 13.

IEEE Journal of Solid–State Circuits, vol. SC–21, No. 1, Feb. 1986, Chiou & Schaumann, "Design and Performance of a Fully Integrated Bipolar 10.7–MHZ Analog Bandpass Filter", pp. 6–14.

(List continued on next page.)

Primary Examiner—Timothy P. Callahan
Assistant Examiner—T. Lam
Attorney, Agent, or Firm—Staas & Halsey

[57] ABSTRACT

A high speed electronic circuit has a cascode circuit configuration and is provided with a bias current source ($CS_0$) between an emitter and a base of a load transistor (Q) in the cascode circuit configuration for compensating a base-emitter voltage ($V_{BE}$) of the transistor to eliminate an adverse effect of charging and discharging at a stray capacitor (C) which can be connected between the base and the emitter of the transistor. The high speed electronic circuit can be applied to an; circuit, a level shift circuit, a level shift discrimination circuit, a signal distribution circuit, a signal synthesization circuit and a frequency band control circuit.

3 Claims, 34 Drawing Sheets

U.S. PATENT DOCUMENTS

| | | | |
|---|---|---|---|
| 4,006,369 | 2/1977 | Taylor | 328/114 |
| 4,121,169 | 10/1978 | Iwamatsu | 330/296 |
| 4,264,873 | 4/1981 | Kominami et al. | 330/288 |
| 4,481,483 | 11/1984 | Kawamura | 330/288 |
| 4,521,736 | 6/1985 | Ryan | 307/246 |
| 4,553,052 | 11/1985 | Takahashi | 307/358 |
| 4,590,435 | 5/1986 | Tanaka | 330/288 |
| 4,642,482 | 2/1987 | Kasperkovitz | 307/264 |
| 4,685,487 | 8/1987 | Radovsky | 330/288 |
| 4,700,144 | 10/1987 | Thomson | 330/288 |
| 4,727,265 | 2/1988 | Nanbu et al. | 307/296.1 |
| 4,812,680 | 3/1989 | Kawashima et al. | 307/350 |
| 4,839,609 | 5/1989 | Hara et al. | 330/257 |
| 4,910,480 | 3/1990 | Crosby | 330/288 |
| 4,920,321 | 4/1990 | Armstrong | 330/257 |
| 5,072,139 | 12/1991 | Nakamura | 307/572 |

FOREIGN PATENT DOCUMENTS

| | | | |
|---|---|---|---|
| 0230693 | 8/1987 | European Pat. Off. | H03F 3/45 |
| 2438938 | 5/1980 | France | H03G 3/30 |
| 52-89043 | 7/1977 | Japan | H03G 3/10 |
| 55-161421 | 12/1980 | Japan | H03K 12/00 |
| 59-228430 | 12/1984 | Japan | H03K 19/092 |
| 60-59813 | 4/1985 | Japan | H03K 3/02 |
| 63-012110 | 6/1988 | Japan | H03K 19/00 |
| 909776 | 8/1960 | United Kingdom . | |
| 2057800 | 4/1981 | United Kingdom | H03G 3/10 |

OTHER PUBLICATIONS

IEEE Journal of Solid–State Circuits, vol. SC–21, No. 4, Aug. 1986, Hebert et al., "Compensation of Bipolar Monolithic Circuits Using the Parasitic Capacitance of Diffused Resistors", pp. 568–574.

Electrical Design News, vol. 31, No. 4, Feb. 1986, F. Boes, "Wien–bridge Filters Enhance Tone Control", p. 241.

Instruments and Experimental Techniques, vol. 16, No. 4, Jul./Aug., 1973, Lysenko & Gurvich, "A Broadband Oscillascopic Amplifier for the Nanosecond Range", pp. 1173–1175.

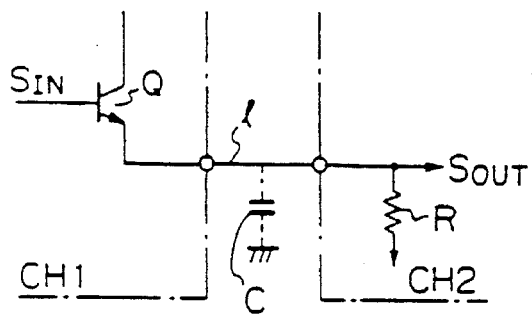
Fig. 1a PRIOR ART
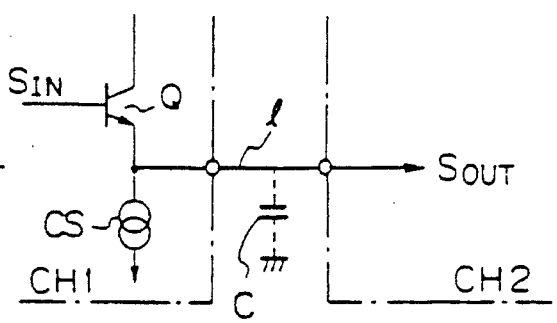
Fig. 1b PRIOR ART
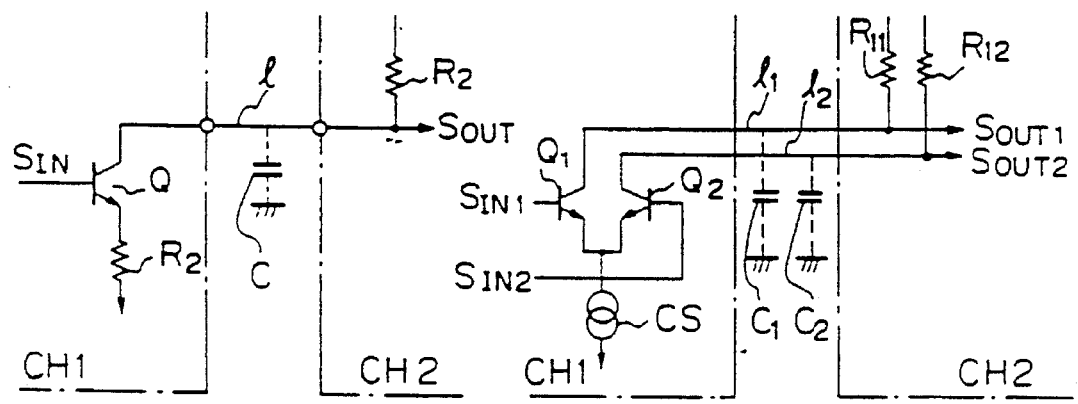
Fig. 1c PRIOR ART
Fig. 1d PRIOR ART
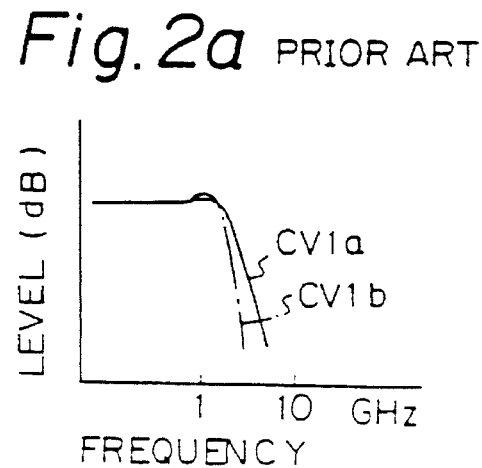
Fig. 2a PRIOR ART
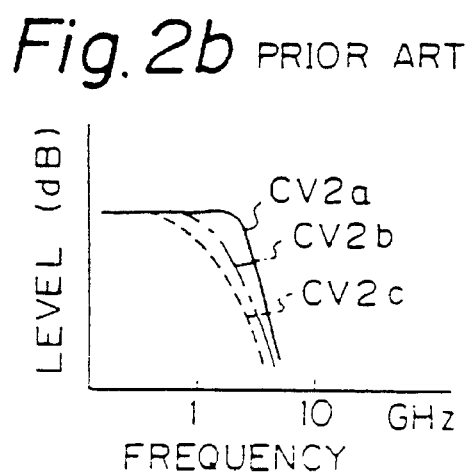
Fig. 2b PRIOR ART Fig. 20
PRIOR ART
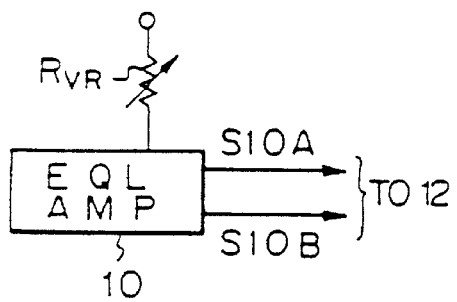
Fig. 21
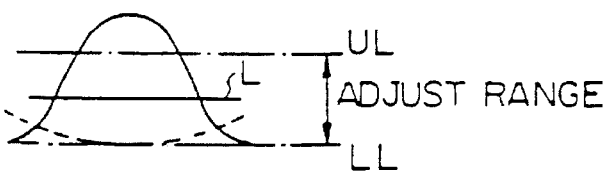
Fig. 22a  Fig. 22b
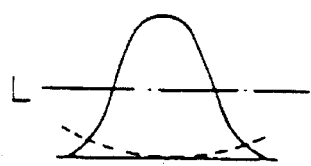 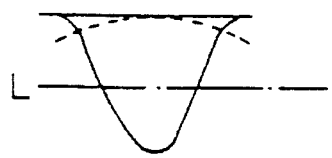
Fig. 23a  Fig. 23b
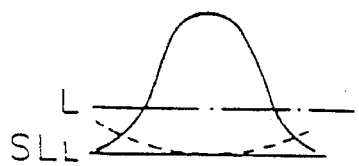 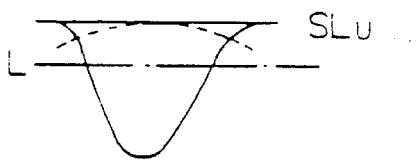

HIGH-SPEED ELECTRONIC CIRCUIT HAVING A CASCODE CONFIGURATION

This application is a continuation of application Ser. No. 08/080,136, filed Jun. 23, 1993, now abandoned, which is a continuation of application Ser. No. 07/874,212, filed Apr. 27, 1992, now abandoned, and which is a continuation of application Ser. No. 07/339,384, filed Mar. 28, 1989, abandoned.

CROSS REFERENCE TO RELATED APPLICATION

This application is a continuation of International Application No. PCT/JP88/00758, filed Jul. 28, 1988, which designates the United States and is now abandoned.

BACKGROUND OF THE INVENTION

1. Technical Field

The present invention relates to an electronic circuit having a cascode configuration. More particularly, it relates to an electronic circuit able to operate at a high speed and/or having a wide frequency band.

2. Background Art

Recent technology advances in data processing systems, such as high speed data communication systems, require improved electronic circuits able to process data at a high speed and/or at a wide frequency band. In particular, for example, in an optical-fiber data communication system, a very high speed data transmission of more than 1.6 giga-bits per second (Gbs) has been attempted, to increase a transmission rate to a propagation speed limit of an optical fiber cable which has a very wide frequency range.

To achieve a high speed operation, a wide frequency margin, and a high stability, a variety of considerations such as a careful selection of circuit elements applied to such electronic circuits, a design of a best circuit arrangement, a rejection of adverse effects by, for example, a stray capacitance and a stray inductance, must be taken into account. Various types of electronic circuits have been applied to such high speed data transmission systems, as an interface circuit, a level shift circuit, a discrimination circuit, etc. However, these prior art electronic circuits still do not provide a satisfactory performance. The prior art electronic circuits will be described below with reference to specific examples.

SUMMARY OF THE INVENTION

An object of the present invention is to provide an improved electronic circuit having a high speed operation time, a wide frequency range and/or a great stability.

Another object of the present invention is to provide an improved interface circuit able to operate at a high speed.

Still another object of the present invention is to provide an improved level shift circuit having a great stability at a high frequency range.

Yet another object of the present invention is to provide an improved discrimination circuit able to discriminate a signal level with a high accuracy.

Another object of the present invention is to provide an improved signal distribution circuit having many fan-outs.

Another object of the present invention is to provide an improved signal synthesization circuit having many fan-ins.

Another object of the present invention is to provide an improved frequency band control circuit having a wide frequency controllable range.

According to a first aspect of the present invention, there is provided a high speed electronic circuit including: a current drive circuit including at least one input transistor, an emitter thereof being operatively grounded and a base thereof receiving an input signal; a load transistor circuit including at least one load transistor, an emitter thereof being connected to a collector of the input transistor and a base of the load transistor being operatively grounded; and a bias current source connected to the emitter, a current supplied from the bias current being supplied to the load transistor to maintain a base-emitter voltage of the load transistor when the load transistor is turned off at a base.emitter transistor of the load transistor when the load transistor is turned on.

The bias current source comprises a current-mirror type current source circuit connected between the emitter of the load transistor and ground. Or, the bias current source comprises at least one resistor connected between the emitter of the load transistor and ground.

The high speed electronic circuit further includes a bias voltage source connected between the base of the load transistor and ground.

According to a second aspect of the present invention, there is also provided an interface circuit including at least one load resistor in addition to the high speed electronic circuit, the load resistor being connected to a collector of the load transistor for outputting a voltage signal corresponding to the input signal, and at least one transfer line connected between a collector of the input transistor in the current drive circuit and the emitter of the load transistor.

The input signal is a data signal logically changing between a high level and a low level.

The current drive circuit includes an input transistor and an input resistor, a base of the input transistor receiving the input signal, and the input resistor being connected between an emitter of the input transistor and ground. The load transistor circuit includes a load transistor, an emitter thereof being connected to a collector of the input transistor, and a collector thereof being connected to the load resistor to output the output signal from a point at which the collector and the load resistor are commonly connected. The current-mirror type current source circuit includes a first current source transistor, a collector of which is connected to the emitter of the load transistor; a first current source resistor supplied with a power supply at a first terminal thereof; a second current source transistor, a collector of which is connected to a second terminal of the first current source resistor and a base thereof, bases of the first and second current source transistors being commonly connected; and second and third current source transistors connected between emitters of the first and second current source transistors and ground, respectively. Or, the current source circuit includes a current resistor connected between the emitter of the load transistor and ground.

The current drive circuit includes first and second input transistors connected in parallel and differentially-operating in response to two input signals connected to bases thereof, and a current source connected between emitters of the first and second input transistors and ground. The load transistor circuit includes first and second load transistors, an emitter of the first load transistor being connected to a collector of the first input transistor, an emitter of the second load transistor being connected to a collector of the second input transistor, and bases of the first and second load transistors being commonly connected and operatively grounded. The interface circuit also include two load resistors connected to collectors of the first and second load transistors, respectively, to output two output signals from points at which collectors and the load resistors are commonly connected. The current-mirror type bias current source circuit includes first to third current source transistors connected in parallel, collectors of the first and second current source transistors being respectively connected to the emitters of the first and second load transistors, a first current source resistor supplied with a high voltage power supply at a first terminal, a second terminal thereof being connected to a collector of the third current source transistor, a base of the third current source transistor being connected to a base thereof, which is commonly connected to bases of the first and second current source transistors, and second to fourth current source resistors respectively connected between emitters of the first to third current source transistors and ground. Or, the source circuit comprises two resistors connected between the emitters of the load transistors and ground, respectively.

According to a third aspect of the present invention, there is further provided a level shift circuit, further including a load resistor circuit including at least one load resistor connected to collectors of the load transistor, in addition to the high speed circuit, and characterized in that the bias current source connected between the emitter and the base of the load transistor includes at least one current source supplying current(s) passing through the load resistor, to shift a level of the output signal by a value defined by the current and a resistance of the load resistor.

Many modifications of the level shift circuit can be obtained similar to those of the interface circuit.

According to a fourth aspect of the present invention, there is provided a signal discrimination circuit further including a latch circuit in addition to the level shift circuit, the latch circuit being connected to the load resistor circuit, and wherein the current drive source is formed as a differential-operation type circuit, the load transistor circuit comprises two load transistors connected in parallel and two current sources connected to the two load transistors for changing voltage drops as level shift values at the load resistors.

According to a fifth aspect of the present invention, there is provided a signal distribution circuit as an application of the electronic circuit, wherein each of a plurality of the load transistor circuits and each of a plurality of load resistors is connected in series, the series-connected circuits are connected in series, the current drive circuit and the bias current source are connected in parallel to each other and connected to an end of the circuits which are connected to the load transistor circuits and the load resistors in series. Or, according to a fifth aspect of the present invention, there is also provided a signal distribution circuit as an application of the electronic circuit, wherein each of a plurality of the load transistor circuits and each of a plurality of load resistors is connected, the series-connected circuits are connected in parallel, the current drive circuit and the bias current source are connected in parallel, and connected to a commonly connected point of the parallel-connected circuits.

According to a sixth aspect of the present invention, there is provided a signal synthesization circuit, as an application of the electronic circuit, wherein a plurality of the current drive circuits are connected in parallel, each current drive circuit receiving an input signal to be synthesized, the load transistor circuit and a load resistor is connected in series to output a synthesized signal, and the bias current source and the emitter of the load transistor in the load transistor circuit are connected to a commonly connected point of the parallel connected current drive circuits.

According to a seventh aspect of the present invention, there is provided a frequency band control amplification circuit including: an amplification circuit including at least one amplification transistor and at least one emitter resistor connected between an emitter of the amplification transistor and ground, a base of the amplification transistor receiving an input signal; a load transistor circuit including at least one load transistor, a base of thereof being operatively grounded, and an emitter thereof being operatively grounded, and an emitter thereof being connected to a collector of the amplification transistor; at least one load resistor connected between a collector of the load transistor and a high voltage supply; and a frequency control circuit having a capacitance, and connected to the commonly connected point of the collector of the amplification transistor and the emitter of the load transistor. An output signal is output from the commonly connected point of the collector of the load transistor and the load resistor, and a frequency band of the output signal is varied in response to the capacitance of the frequency control circuit.

BRIEF DESCRIPTION OF THE DRAWINGS

FIGS. 1a, 1b, 1c and 1d are circuit diagrams of prior art interface circuits;

FIGS. 2a and 2b are graphs representing frequency characteristics of the interface circuits shown in FIGS. 1a to 1d;

FIG. 20 is a circuit diagram of a prior art variable equalizing amplifier;

FIG. 21 is a graph of the equalized signal SI0A produce by the circuit of FIG. 20;

FIGS. 22a, 22b, 23a and 23b are graphs illustrating a signal discrimination of a signal discrimination circuit of the present invention;

FIGS. 54, 65 to 66 are circuit diagrams of modifications of the circuit shown in FIG. 61.

DESCRIPTION OF THE PREFERRED EMBODIMENTS

Figure 3:
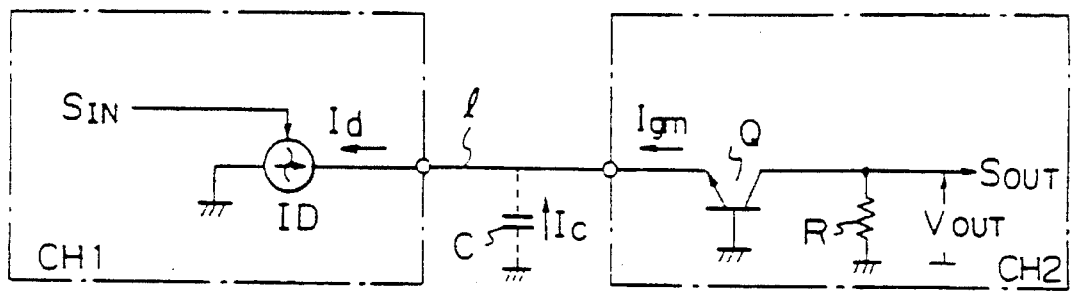
FIG. 3 is a principle circuit diagram of an interface circuit forwarding to an interface circuit according to the present invention.

First, an interface circuit, as one of the electronic circuits of the present invention, will be described.

Before describing the interface circuit of the present invention, prior art interface circuits will be described with reference to the drawings.

FIGS. 1a to 1d show prior art interface circuits. FIG. 1a shows an open-emitter type interface circuit, FIG. 1b shows an emitter-follower type interface circuit, FIG. 1c shows an open-collector type interface circuit, and FIG. 1d shows a differential-operation and open-collector type interface circuit. In the drawings, reference CH1 denotes a transmission side integrated circuit (IC) chip, CH2 denotes a reception side IC chip, Q, $Q_1$ and $Q_2$ denote npn-type transistors, R, $R_{11}$ and $R_{12}$ denote resistors, CS denotes a constant current source, l, $l_1$ and $l_2$ denote data transmission lines, and C, $C_1$ and $C_2$ denote stray capacitors. The IC chip CH1 is provided at a data transmission side, the IC chip CH2 is provided at a data reception side, and the data transmission line(s) l or $l_1$ and $l_2$ is (are) provided therebetween. The stray capacitor(s) C or $C_1$ and $C_2$ may be connected to the data transmission line(s) l or $l_1$ and $l_2$.

The open-emitter type interface circuit shown in FIG. 1a is a voltage signal propagation type interface circuit. An input impedance of the transmission side IC chip CH1 is low, and an input impedance of the reception side IC chip IC2 is high. A frequency band $f_{-3dB}$ at which a gain is lowered by 3 dB is expressed by the following formula:

$$f_{-3dB} = \frac{1}{2 C_S \cdot r_E} \quad (1)$$

where, $C_S$ represents a capacitance of the stray capacitor(s) C or $C_1$ and $C_2$, and $r_e$ represents an emitter resistance of the transistor(s) Q or $Q_1$ and $Q_2$.

FIG. 2a shows a frequency characteristic of the open-type interface circuit shown in FIG. 1a. In the drawing, curve $CV1_a$ shows a frequency characteristic when the stray capacitance $C_S$ is 0.5 pF, and curve $CV1_b$ shows a frequency characteristic when the stray capacitance $C_S$ is 5 pF. Since the emitter resistance $r_E$ is small, an effect due to the stray capacitor is reduced and a frequency band where a gain is lowered by 3 dB is broad, but a distortion, such as peaking occurs.

The emitter-follower type interface circuit shown in FIG. 1b also suffers from the above defect.

In FIGS. 1c and 1d, since the load resistor(s) $R_1$ or $R_{11}$ and $R_{12}$ is (are) connected to the stray capacitor(s) in parallel, the frequency $f_{-3db}$ is expressed as follows:

$$f_{-3dB} = \frac{1}{2 R_L \cdot C_S} \quad (2)$$

where, $R_L$ represents a resistance of the load resistor(s) $R_1$ or $R_{11}$ and $R_{12}$.

FIG. 2b shows a frequency characteristic of the interface circuits shown in FIGS. 1c and 1d. In FIGS. 2b, curves $CV2_a$, $CV2_b$, and $CV2_c$ show frequency characteristics where the stray capacitance $C_S$ are 0.1 pF, 0.5 pF and 1.0 pF, respectively. The resistance $R_L$ of the load resistor(s) $R_1$ or $R_{11}$ and $R_{12}$ can not be made too small because an output signal(s) $S_{OUT}$ or $S_{OUT1}$ and $S_{OUT2}$ having a predetermined amplitude must be provided, an effect due to the stray capacitance $C_S$ can not be eliminated, as shown in FIG. 2b.

The inventors of the present application devised a novel interface circuit which definitely eliminates the above adverse effect due to the stray capacitance ("Interface circuit", filed on Jun. 20, 1986 at Japan P.O. and published on Jan. 6, 1988, as JPA 63-1211). FIG. 3 shows a principle interface circuit, which comprises a current drive source ID in a transmission side IC chip CH1, and, an npn-type transistor Q in which a base is grounded and an emitter is connected to the current drive source ID through a transfer line 1, and a load resistor R in a reception side IC chip CH2. A stray capacitor C may be connected to the transfer line 1. A current $I_d$ which is extracted from the current drive source ID is defined by the following formula:

$$I_d = I_c + I_{gm} \quad (3)$$

where, $I_c$ is a current supplied by the stray capacitor C, and $I_{gm}$ is a current supplied by the transistor Q.

An output voltage $V_{OUT}$ of an output signal $S_{OUT}$ is expressed as follows:

$$V_{OUT} = R_L \cdot I_{gm} \quad (4)$$

where, $R_L$ is a resistance of the load resistor R.

A voltage $V_C$ generated at the stray capacitor C is expressed by $$V_C = \frac{I_c}{jwC_S} = \frac{I_{gm}}{g_m} \quad (5)$$

where, $C_S$ is a capacitance of the stray capacitor C, and $g_m$ is a mutual conductance of the transistor Q.

Accordingly, from the above formulas (3) to (5), the output voltage $V_{OUT}$ of the output signal $S_{OUT}$ is expressed by the following formula:

$$V_{OUT} = R_L \cdot \frac{1}{1 + \frac{jwC_S}{g_m}} I_d \quad (6)$$

As a result, a frequency $f_{-3dB}$, a gain which is lowered by 3 dB, is expressed by the following formula:

$$f_{-3dB} = \frac{g_m}{2\pi C_S} \quad (7)$$

Figure 4:
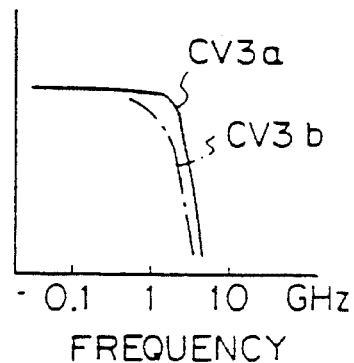
FIG. 4 is a graph representing a frequency characteristic of the interface circuit shown in FIG. 3.

FIG. 4 shows a graph of a frequency characteristic of the interface circuit shown in FIG. 3. In the drawing, curves $CV3_a$ and $CV3_b$ show the frequency characteristics when the stray capacitances $C_S$ are 1 pF and 5 pF, respectively. More concretely, when a DC current component of the current drive source ID is 2 mA, a resistance: $1/g_m$ is 13 Ω and, when the stray capacitance $C_S$ is 1 pF, the frequency $f_{-3db}$ is 12 Giga-Hertz (GHz). Apparently, this interface circuit shown in FIG. 3 is not substantially effected by the stray capacitance $C_S$ of approximately 1 pF on signal transfer at approximately 10 GHz.

Figure 5A:
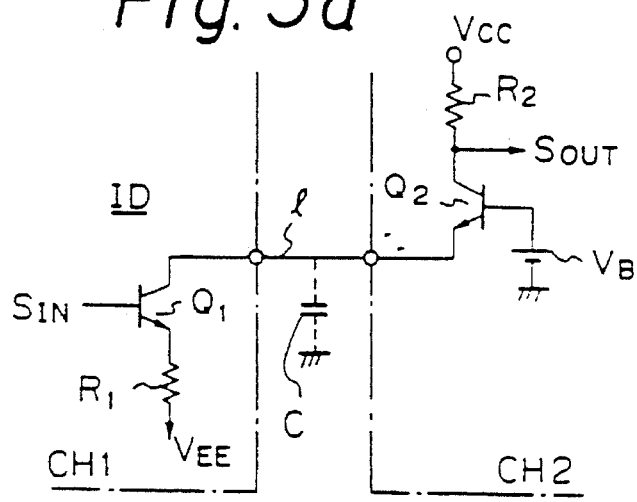
FIGS. 5a and 5b are specific circuit diagrams of the interface circuit shown in FIG. 3.
Figure 5B:
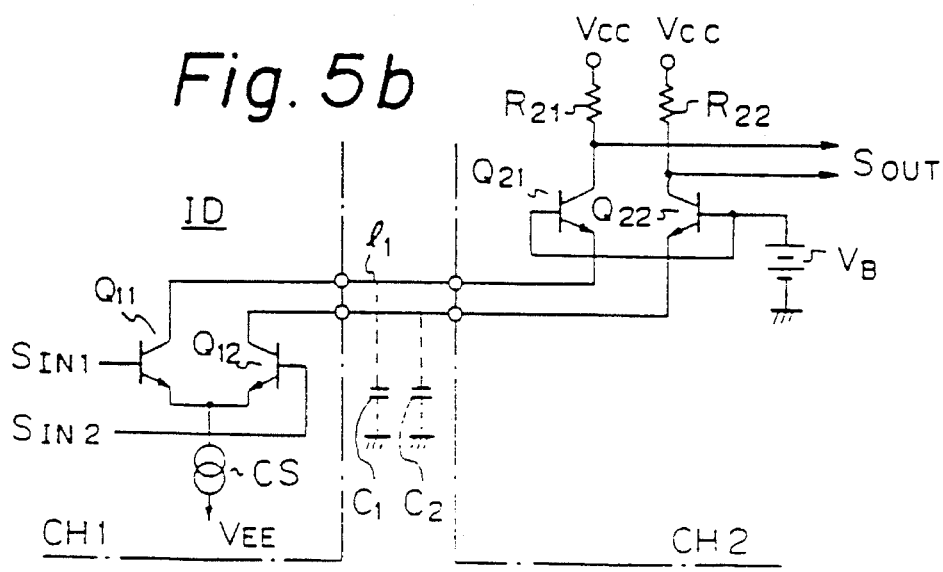

FIGS. 5a and 5b show specific circuits of the interface circuit of shown in FIG. 3. The circuit shown in FIG. 5a comprises the current drive source ID consisting of an npn-type transistor $Q_1$ and an emitter resistor $R_1$ having a terminal connected to an emitter of the transistor $Q_1$ and another terminal connected to a low voltage supply $V_{EE}$ which may be ground. The circuit also comprises an npn-type transistor $Q_2$ having an emitter connected to a collector of the transistor $Q_1$ through the transfer line 1 and a base supplied with a bias voltage supply $V_B$, and a load resistor $R_2$ connected between a high voltage supply $V_{CC}$ and a collector of the transistor $Q_2$. At the IC chip CH1, an input signal $S_{IN}$ is supplied to a base of the transistor $Q_1$, and at the IC chip CH2, an output signal $S_{OUT}$ is output from a point at which the load resistor $R_2$ and the collector of the transistor $Q_2$ are commonly connected. The stray capacitor C is connected to the transfer line 1.

Note that the interface circuit shown in FIG. 5a is formed by a "cascode configuration", since the emitter of the transistor $Q_1$ is grounded through the resistor $R_1$, the collector of the transistor $Q_1$ and the emitter of the transistor $Q_2$ are connected, and the base of the transistor $Q_2$ is grounded through the bias voltage supply $V_B$. In general, a cascode amplifier having the above configuration is used for a high frequency amplification, because an input signal side and a load side are separated and an internal feedback is small, and thus a high speed operation can be established. A total gain of the cascode amplifier is equal to a gain of a load transistor, because a load at a first step is a resistor of an input transistor in the second step, i.e., an emitter resistance $r_E$ of the input transistor which is very small. In JPA 63-1211, the above high speed operation feature of the cascode configuration, and the elimination of the effect of stray capacitor due to a Miller effect, obtained by grounding the base of the load transistor are used for an interface circuit operable at a high frequency.

In FIG. 5b, the current drive source ID is constructed by differential operation transistor pair $Q_{11}$ and $Q_{12}$ and a constant current source CS. The load (output) circuit also includes a pair of transistors $Q_{21}$ and $Q_{22}$, a pair of load resistors $R_{21}$ and $R_{22}$, and the bias voltage supply $V_B$. Emitters of the transistors $Q_{11}$ and $Q_{12}$ are grounded through the constant current source CS, and bases of the transistors $Q_{21}$ and $Q_{22}$ are grounded through the bias voltage supply $V_B$. Accordingly, this interface circuit shown in FIG. 5b has a cascode configuration.

Nevertheless, the interface circuit described in JPA 63-1211 still suffers from the effect of a large stray capacitance at a high frequency when the input signal $S_{IN}$ has a large amplitude, for example, 800 mV or more.

Figure 6A:
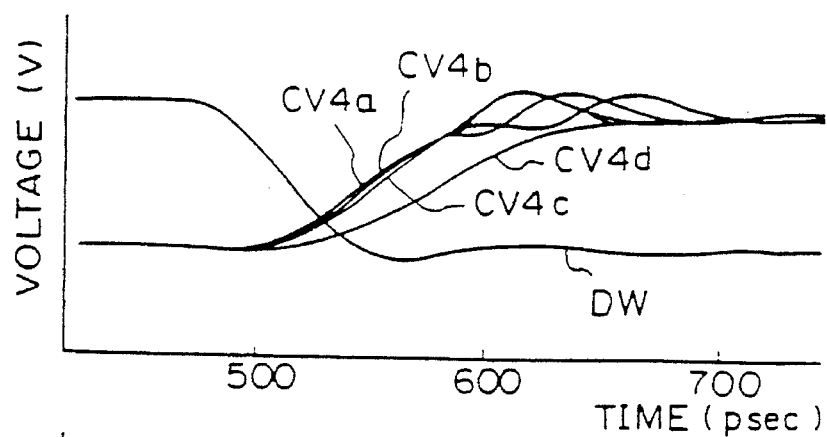
FIGS. 6a and 6b are graphs representing rising and trailing wave forms of an output signal in FIG. 3.
Figure 6B:
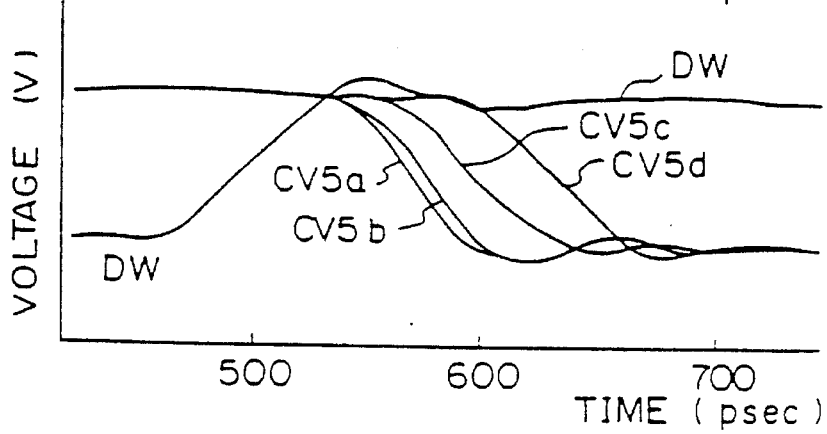

FIGS. 6a and 6b show graphs of response characteristics of the interface circuit shown in FIG. 3, obtained by simulation. FIG. 6a shows rising wave forms of the output signal $S_{OUT}$ to a drive signal, i.e., the input signal $S_{IN}$, represented by curve DW, and FIG. 6b shows trailing (falling) wave forms to the drive signal. In FIG. 6a, curves $CV4_a$ to $CV4_d$ show rising wave forms of the output signal $S_{OUT}$ when the stray capacitances are 0.1 pF, 0.5 pF, 1.0 pF and 5.0 pF, respectively. The variation of rising times is small, but a large ringing appears due to the stray capacitance. In FIG. 6b, curves $CV5_a$ to $CV5_d$ show trailing wave forms of the output signal $S_{OUT}$ when the stray capacitance are 0.0 pF, 0.1 pF, 0.5 pF and 1.0 pF, respectively. The start points of the trailing are greatly varied due to the stray capacitance, and the ringing is also large.

Figure 7A:
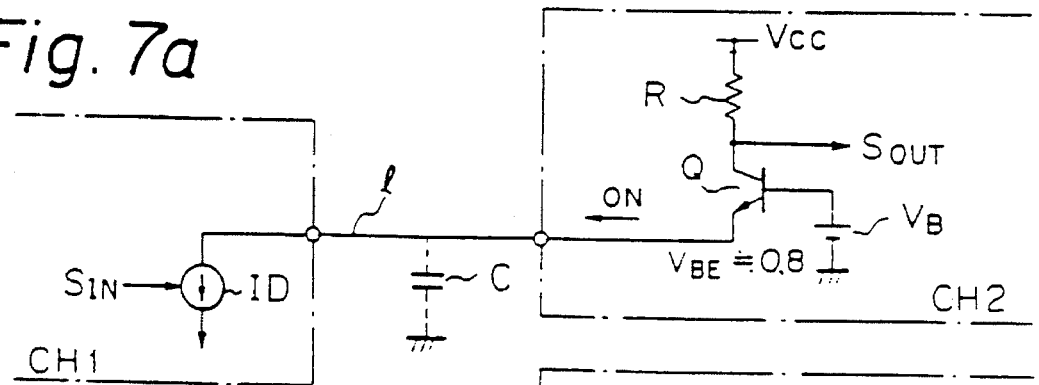
FIGS. 7a and 7b are circuit diagrams explaining the rising and trailing operation of the interface circuit shown in FIG. 3.
Figure 7B:
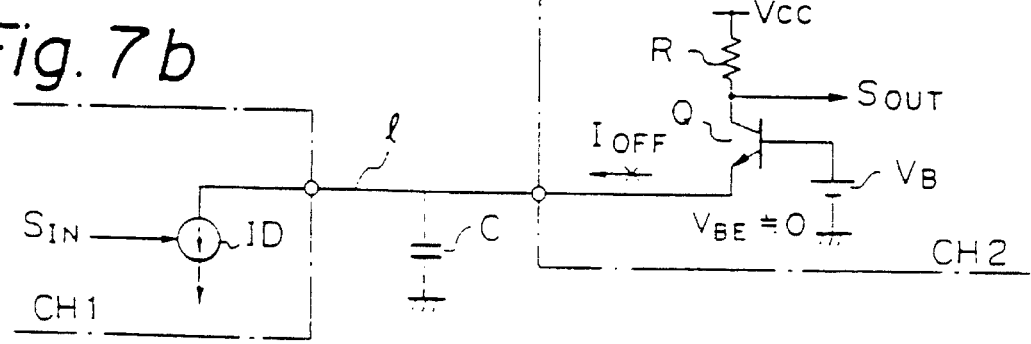

The above defects will be discussed with reference to the circuits shown in FIGS. 7a and 7b, corresponding to the interface circuit shown in FIG. 3. First, an operation when the input signal $S_{IN}$ having a large amplitude and changed from low level to high level is supplied to the current drive source ID will be described with reference to FIG. 7a. Upon receipt of the high level input signal $S_{IN}$, the current drive source ID, more specifically the transistor in the current drive source, is turned ON. As a result, the load transistor Q is also turned ON, and supplies an on current $I_{ON}$ to the current drive source ID. A voltage $V_{BE}$ between the base and the emitter of the transistor Q is varied in response to a current flowing through the base and the emitter, i.e., the on current $I_{ON}$. When the current is equal to or higher than 0.1 mA, the base-emitter voltage $V_{BE}$ of the load transistor Q is approximately 0.8 V. A voltage $V_l$ between the transfer line 1 and ground is $V_l = V_B - V_{BE}$, where $V_B$ denotes a base voltage of the transistor Q. When the flow of the on-current $I_{ON}$ occurs, the stray capacitor C is discharged until the voltage $V_l$ becomes $V_B=V_{BE}$, and this distorts the rising wave form as shown in FIG. 6a. Second, an operation when the input signal $S_{IN}$ is changed from high level to low level will be described with reference to FIG. 7b. The input transistor in the current drive source ID is turned OFF, and the load transistor Q is turned OFF. As a result, an off current $I_{OFF}$ supplied from the load transistor Q to the current drive source ID becomes approximately 0 mA, and the voltage $V_{BE}$ becomes 0 V. Consequently, the voltage $V_l$ on the transfer line 1 becomes $V_B$. The stray capacitor C is charged until the voltage $(V_B-V_{BE})$ becomes $V_B$. This distorts the trailing wave form as shown in FIG. 6b. Namely, the voltage $V_l$ on the transfer line 1 is varied by the voltage $V_{BE} \approx 0.8$ V, and the stray capacitor C is discharged or charged in response to the change of the transfer line voltage $V_l$. A delay time $t_d$ of the trailing edge and the rising edge can be expressed by the following formula:

$$t_d = \frac{C_S V_{BE}}{I_d} \quad (8)$$

where, $I_d$ represents a current passing through the current drive source ID.

Now, a principle of an interface circuit of the present invention will be described with reference to FIGS. 8a and 8b. The interface circuits shown in FIGS. 8a and 8b eliminate the change of the transfer line voltage $V_l$, and thus eliminate the charging and discharging of the stray capacitor C, to shorten the rising time and the trailing time.

Figure 8A:
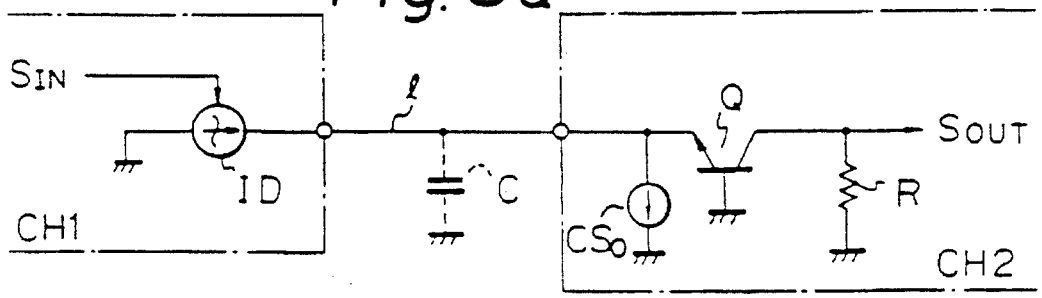
FIGS. 8a and 8b are circuit diagrams showing the principle of an interface circuit in accordance with the present invention.

In FIG. 8a, the interface circuit includes a current drive source ID in a transmission side IC chip CH1. The interface circuit also includes, at a reception side IC chip CH2, a load (output) transistor Q and a load resistor R. Between the chips CH1 and CH2, a transfer line 1 is provided, and a stray capacitor C can be connected to the transfer line 1. The current drive circuit ID includes an input transistor (not shown), an emitter thereof being grounded. A base of the load transistor Q is connected to a collector of the input transistor, and a base thereof is grounded. The above circuit construction is substantially the same as that of the interface circuit shown in FIG. 3, and thus the interface circuit shown in FIG. 8a has a cascode configuration. In addition to the above circuit configuration, the interface circuit shown in FIG. 8a includes a bias current source $CS_0$ connected between the emitter and the base of the load transistor Q in the reception side IC chip CH2. The bias current source $CS_0$ provides a constant current $I_{CS}$ corresponding to a current $I_{BE}$ flowing through the base and the emitter of the load transistor, i.e., the above on-current $I_{ON}$, Q when the transistor Q is turned ON, for cancelling the current $I_{BE}$. Namely, the constant current $I_{CS}$ has an amplitude sufficient to prevent the change of the voltage $V_l$ on the transfer line 1, i.e., to prevent the change of the base-emitter voltage $V_{BE}$ of the load transistor and has a polarity which is the reserve of a polarity of the on current $I_{ON}$. In other words, the constant current $I_{CS}$ generates a voltage between the base and the emitter of the transistor Q opposite to the base-emitter voltage $V_{BE}$ of the load transistor Q when the load transistor Q is turned ON. In general, the constant current $I_{CS}$ may be 0.5 mA or higher. Taking a margin into consideration, the constant current $I_{CS}$ may be 0.5 mA.

The bias current source $CS_0$ always provides the constant current $I_{CS}$ to the load transistor Q to suppress the change of the base-emitter voltage $V_{BE}$, so that the voltage $V_l$ on the transfer line 1 is not changed regardless of the change of the status of the load transistor Q, i.e., the change between the ON state and the OFF state, of the load transistor Q. Accordingly, the charging and discharging of the stray capacitor C are avoided, and generation of the distortion of the rising signal and the trailing signal is prevented.

Figure 8B:
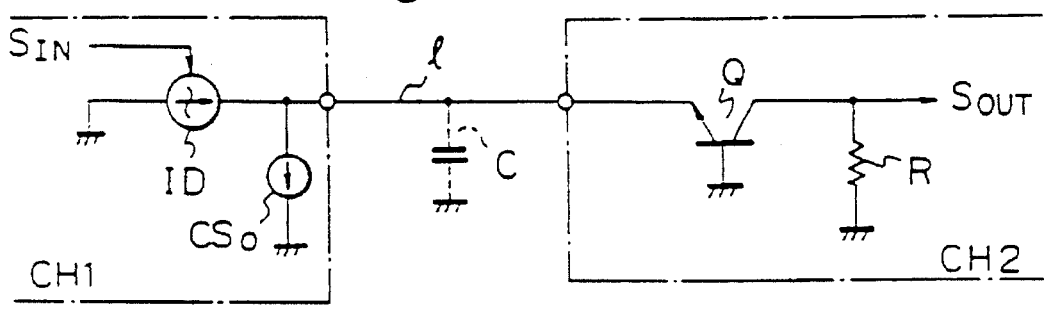

As shown in FIG. 8b, the bias current source $CS_0$ can be provided at the transmission side IC chip CH1. Since the bias current source $CS_0$ is connected between the base and the emitter of the load transistor Q, the operation is same as that described above.

In FIGS. 8a and 8b, by providing the bias current source $CS_0$, a DC level of the output signal $S_{OUT}$ can be made lower than that of the interface circuit shown in FIG. 3, and thus the resistance $R_L$ of the load resistor R should be greater than that of the load resistor shown in FIG. 3. In addition, a current flowing through the load transistor Q may be increased, and a capacity of the load transistor Q may become larger than that of the transistor shown in FIG. 3. However, note that an amplitude of the output signal $S_{OUT}$, per se, is not changed, regardless of the provision of the bias current source $CS_0$.

Figure 9A:
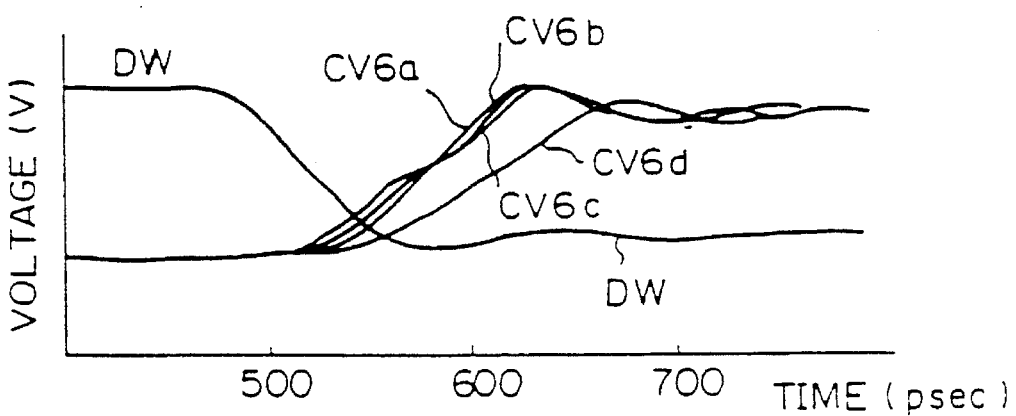
FIGS. 9a and 9b are graphs representing rising and trailing wave forms of an output signal in FIGS. 8a and 8b.
Figure 9B:
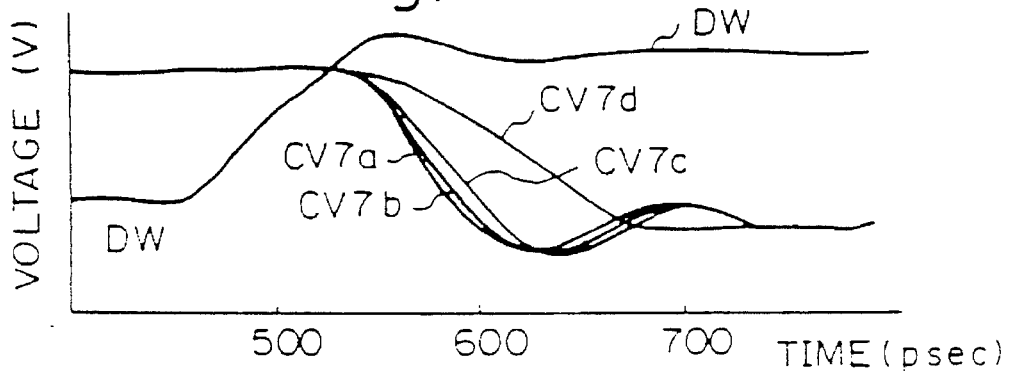

FIGS. 9a and 9b show the characteristic curves of the interface circuits shown in FIGS. 8a and 8b obtained by simulation. FIG. 9a shows a rising characteristic. In FIG. 9a, curves $CV6_a$ to $CV6_d$ represent the rising characteristics corresponding to the change of the drive signal, i.e., the input signal $S_{IN}$, represented by curve DW, when the stray capacitances $C_S$ are 0.1 pF, 0.5 pF, 1.0 pF, and 5.0 pF. These curves $CV6_a$ to $CV6_d$ correspond to the curves $CV4_a$ to $CV4_d$ in FIG. 6a. Compared with these, as shown in FIG. 6a, the characteristics shown by the curves $CV4_a$ to $CV4_c$ when the stray capacitances are 0.1 pF, 0.5 pF, and 1.0 pF are greatly varied therebetween, but on the other hand, as shown in FIG. 9a, the characteristics shown by the curves $CV6_a$ to $CV6_c$ are not varied with respect to each other. This means that the transfer line 1 in the interface circuit shown in FIG. 8a can installed at a short distance or a long distance without any circuit adjustment. The characteristics shown by the curves $CV7_a$ to $CV7_c$ in FIG. 9b illustrate the same thing.

Figure 10A:
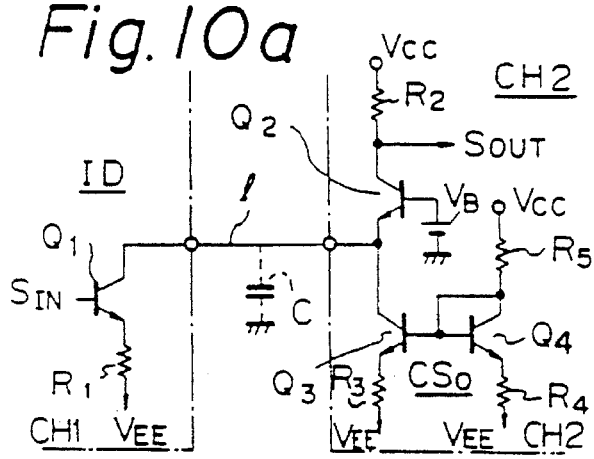
FIGS. 10a, 10b, 10c and 10d are circuit diagrams of embodiments of an interface circuit in accordance with the present invention.
Figure 10B:
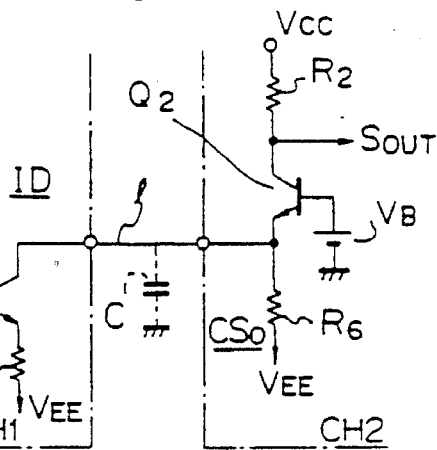
Figure 10C:
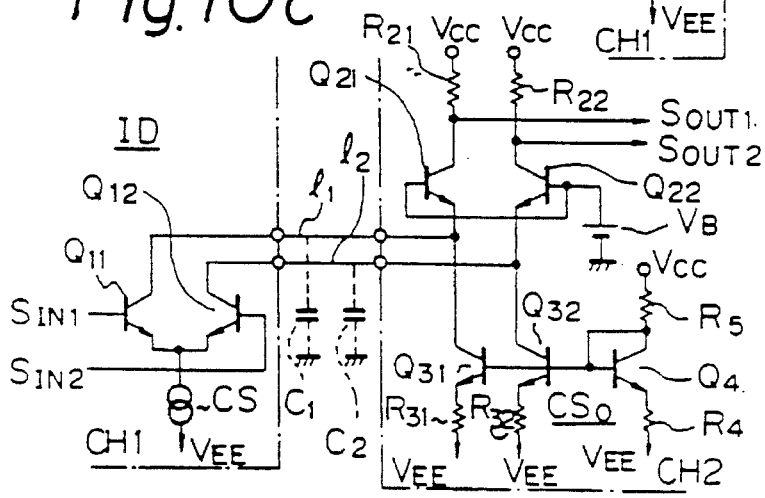
Figure 10D:
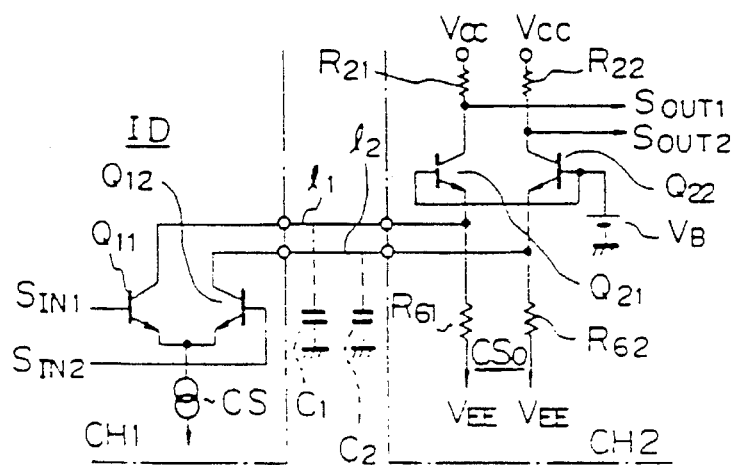

FIGS. 10a to 10d show circuit diagrams of an embodiment of the interface circuit in accordance with the present invention. The interface circuits shown in FIGS. 10a and 10b are the open-collector type interface circuits corresponding to the interface circuit shown in FIG. 5a. In FIG. 10a, the bias current source $CS_0$ is formed by a current-mirror type current source composed of npn-type transistors $Q_3$ and $Q_4$, resistors $R_3$ and $R_4$, and a resistor $R_5$. The current-mirror type current source, per se, is well known. In FIG. 10b, the bias current source $CS_0$ is formed by a resistor $R_6$. The interface circuits shown in FIGS. 10c and 10d are differential-operation and open-collector type interface circuits corresponding to the interface circuit shown in FIG. 5b. In FIG. 10c, the bias current source $CS_0$ is formed by a current-mirror type constant current source composed of npn-type transistors $Q_{31}$, $Q_{32}$ and $Q_4$, and resistors $R_{31}$, $R_{32}$, $R_4$ and $R_5$. In FIG. 10d, the bias current source $CS_0$ is formed by two resistors $R_{61}$ and $R_{62}$.

The interface circuits shown in FIGS. 10a to 10d can be provided with the bias current source $CS_0$ at the transmission side IC chip CH1.

When the input signal $S_{IN}$ is a high frequency repetition signal, such as a clock signal, in the base-grounded interface circuit shown in FIG. 3, a wave form distortion may not occur, since a charge accumulated in the stray capacitor is not fully discharged, and the base-emitter voltage $V_{BE}$ is not substantially changed. But, when the input signal $S_{IN}$ is a data signal which may be formed by continuous one's data or continuous zero's data, a wave form distortion can occur at a transient state where an end of the continuous one's data is followed by a first of the continuous zero's data, or vice versa. In this case, the interface circuit of the present invention is preferably used.

In particular, the interface circuit of the present invention is very useful when forming interfaces, such as an interface between circuits in a gate array integrated circuit chip wherein a wiring pattern capacitance is considerably large, and an interface between chips wherein a bonding pad capacitance can not be neglected.

According to the interface circuit of the present invention, since the frequency characteristic and the wave response characteristic are not effected by the stray capacitor, high speed data transmission can be achieved.

Second, a level shift circuit of the present invention will be described.

In the case of data processing at a high speed, a level shift of a DC bias level of a signal by a predetermined voltage is required. For example, in an amplification circuit, a DC level of an input signal can be shifted to a level equal to a reference voltage by using the level shift circuit.

Figure 11:
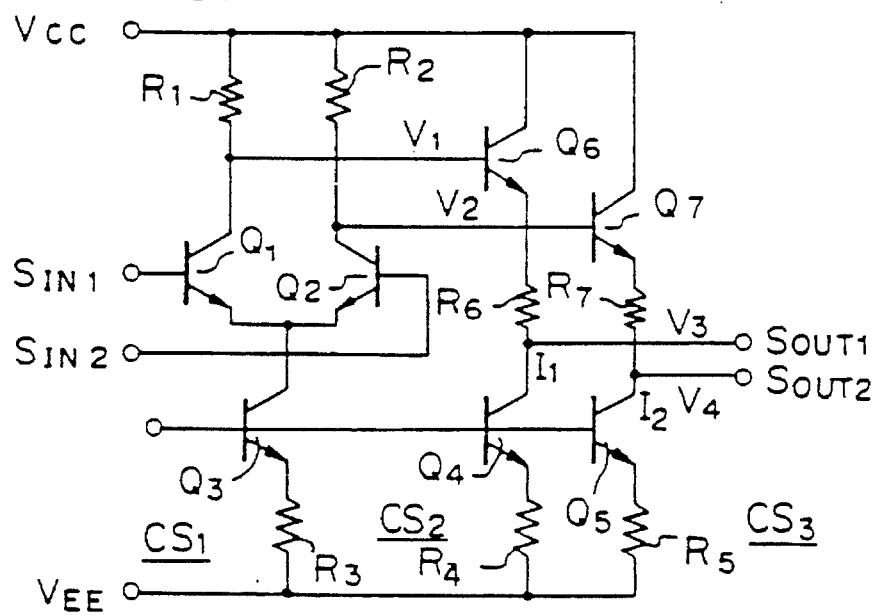
FIGS. 11 and 12 are circuit diagrams of prior art level shift circuits.

FIG. 11 shows a prior art differential-operation type level shift circuit. In the drawing, the level shift circuit includes a pair of differential-operation transistors $Q_1$ and $Q_2$, a first current source $CS_1$ consisting of a transistor $Q_3$ and a resistor $R_3$, a second current source $CS_2$ consisting of a transistor $Q_4$ and a resistor $R_4$, a third current source $CS_3$ consisting of a transistor $Q_5$ and a resistor $R_5$, output emitter follower transistors $Q_6$ and $Q_7$, and resistors $R_1$, $R_2$, $R_6$ and $R_7$. Upon receipt of input signals $S_{IN1}$ and $S_{IN2}$ at bases of the transistors $Q_1$ and $Q_2$, a pair of differential-operated output voltages $V_1$ and $V_2$ are respectively extracted from points at which collectors of the transistors $Q_1$ and $Q_2$ and the load resistors $R_1$ and $R_2$ are commonly connected, and supplied to bases of the transistors $Q_6$ and $Q_7$. Output signals $S_{OUT1}$ and $S_{OUT2}$ having voltages $V_3$ and $V_4$, respectively, are output from points at which collectors of the transistors $Q_4$ and $Q_5$ and the resistors $R_6$ and $R_7$ are commonly connected. The voltages $V_1$ and $V_3$, and the voltages $V_2$ and $V_4$ have the following relationships:

$$V_1 = V_{BE} + I_1 R_6 + V_3 \quad (9)$$

$$V_2 = V_{BE} + I_2 R_7 + V_4 \quad (10)$$

where, $V_{BE}$ is a base-emitter voltage of the transistors $Q_4$ and $Q_5$, $R_6$ and $R_7$ are resistances of the resistors $R_6$ and $R_7$, $I_1$ is a current passing through the transistor $Q_4$, and $I_2$ is a current passing through the transistor $Q_5$.

Namely, the output voltages $V_3$ and $V_4$ are shifted from the voltages $V_1$ and $V_2$ by $(V_{BE} + I_1 R_6)$ and $(V_{BE} + I_2 R_7)$. In this level shift circuit, the levels to be shifted can be easily changed continuously by changing the currents $I_1$ and $I_2$ of the current sources $CS_2$ and $CS_3$.

Figure 12:
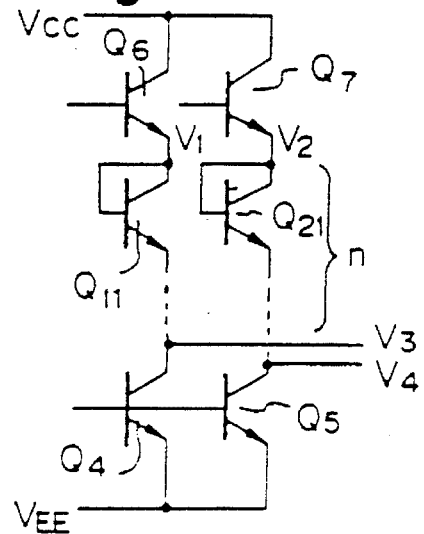

FIG. 12 shows a prior art diode-type level shift circuit. In the drawing, n-series connected transistors, for example, $Q_{11}$, each connected between a collector and a base and functioning as a diode, are connected between transistors $Q_6$ and $Q_4$. Similarly, n-series connected transistors, for example, $Q_{21}$, each connected between a collector and a base and functioning as a diode, are connected between transistors $Q_7$ and $Q_5$. In the drawing, the following relationships stand:

$$V_1 = (n+1)V_{BE} + V_3 \quad (11)$$

$$V_2 = (n+1)V_{BE} + V_4 \quad (12)$$

where, $V_{BE}$ is a base-emitter voltage of the diode-functioning transistor.

Namely, by changing the number of the diode-changing transistors, a level shift voltage $(n+1)V_{BE}$ can be changed in a stepwise manner.

Figure 13:
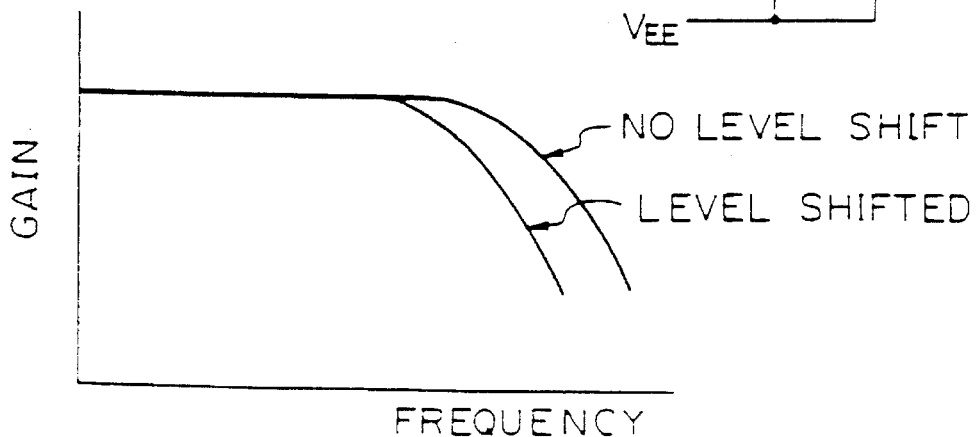
FIG. 13 is a graph representing the frequency characteristic of the level shift circuit shown in FIG. 11.

FIG. 13 shows a graph of frequency characteristics of the level shift circuits shown in FIGS. 11 and 12. In the level shift circuit shown in FIG. 11, due to the resistors $R_6$ and $R_7$ at the emitter follower circuits and stray capacitors which can be connected to the emitter follower circuits, as shown in FIG. 13, the frequency characteristic is reduced, and accordingly, a wave response characteristic is reduced. As a result, the level shift circuit in FIG. 11 can not be applied to a high speed circuit. The level shift circuit shown in FIG. 12 has the same problem as that described above.

In general, in order to realize a high speed operation level shift circuit without a distortion of a wave form, several design techniques can be utilized, for example, reducing the resistances of the series-connected resistors $R_6$ and $R_7$, reducing capacitances of the stray capacitors, and arranging a circuit construction in which the stray capacitors are replaced by other portions directly effecting the characteristic. Nevertheless, these countermeasures are limited in practice.

Conversely, a circuit providing a bias current source $CS_0$ in addition to the cascode configuration as shown in FIGS. 8a and 8b prevents a distortion of a wave form of a output signal and the reduction of a variety of characteristics, due to the stray capacitance. In this invention, the above feature is used to form a high speed level shift circuit without the reduction of the frequency characteristic and the wave response characteristic.

Figure 14:
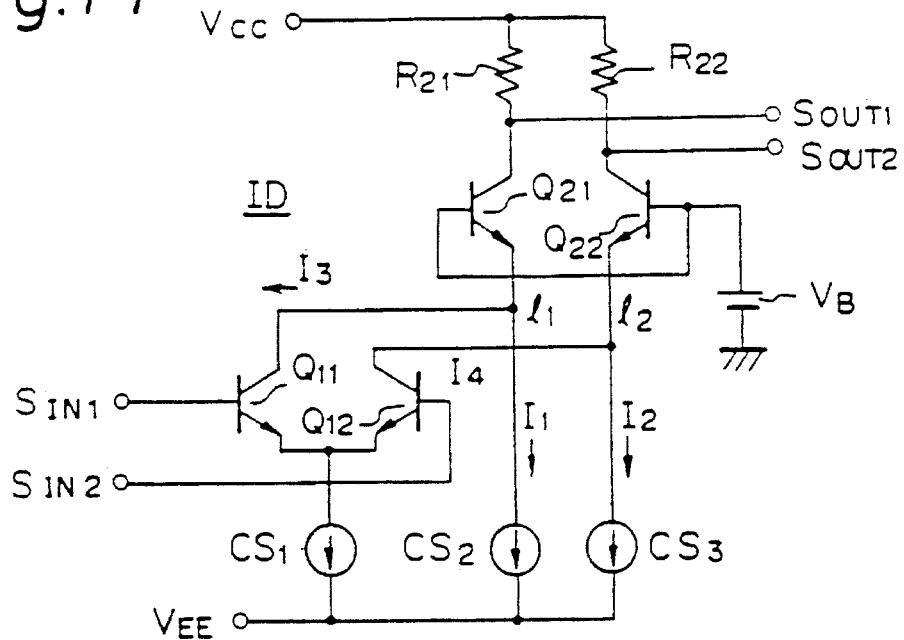
FIG. 14 is a circuit diagram showing the principle of a level shift circuit in accordance with the present invention.

FIG. 14 shows a principle circuit diagram of a level shift circuit in accordance with the present invention. The level shift circuit includes a pair of differential-operation transistors $Q_{11}$ and $Q_{12}$, and a constant current source $CS_1$ connected between collectors of the transistors $Q_{11}$ and $Q_{12}$ and a low voltage line $V_{EE}$ which may be ground. The level shift circuit also includes load resistors $R_{21}$ and $R_{22}$, load transistors $Q_{21}$ and $Q_{22}$, a bias voltage supply $V_B$, and level shift current sources $CS_2$ and $CS_3$.

The emitters of the transistors $Q_{11}$ and $Q_{12}$ are grounded through the constant current source $CS_1$, collectors of the transistors $Q_{11}$ and $Q_{12}$ are connected to emitters of the transistors $Q_{21}$ and $Q_{22}$, and bases of the transistors $Q_{21}$ and $Q_{22}$ are grounded through the bias voltage supply $V_B$. Accordingly, the above circuit has a cascode configuration. In addition, the variable current sources $CS_2$ and $CS_3$ corresponding to the bias current source $CS_0$ shown in FIG. 8a, are connected between the emitters of the transistors $Q_{21}$ and $Q_{22}$ and the low voltage line $V_{EE}$, which is ground.

A differential-operation pair circuit, corresponding to the current drive circuit ID in FIG. 8a, consisting of the transistors $Q_{11}$ and $Q_{12}$ and the constant current sources $CS_1$, receives voltage input signals $S_{IN1}$ and $S_{IN2}$, and changes to currents $I_3$ and $I_4$ flowing therethrough. The currents $I_3$ and $I_4$ are varied in response to the voltages of the input signals $S_{IN1}$ and $S_{IN2}$. The constant current source $CS_1$ supplies a current of a sum of $I_3$ and $I_4$. The above currents $I_3$ and $I_4$ are made to flow through the load resistors $R_{21}$ and $R_{21}$, resulting in voltage drops $V_{21} = I_3 \cdot R_{21}$ and $V_{22} = I_4 \cdot R_{22}$ which are output signals $S_{OUT1}$ and $S_{OUT2}$. In addition, currents $I_1$ and $I_2$ supplied by the level shift current sources $CS_2$ and $CS_3$ are made to flow through the load resistors $R_{21}$ and $R_{22}$, resulting in further voltage drops $V_{L1} = I_1 \cdot R_{21}$ and $V_{22} = I_2 \cdot R_{22}$. These voltage drops $V_{L1}$ and $V_{L2}$ are level-shifted values. Since the currents $I_1$ and $I_2$ can be changed by adjusting the current sources $CS_2$ and $CS_3$, the level shift voltages $V_{L1}$ and $V_{L2}$ can be continuously changed.

The basic condition of the interface circuits shown in FIGS. 8a and 8b and FIGS. 10a to 10d can be applied to the level shift circuit shown in FIG. 14, except for the variable level shift current sources $CS_2$ and $CS_3$. Therefore, the features of the interface circuit are maintained in the level shift circuit. A basic difference between the interface circuit and the level shift circuit of the present invention is the provision of the constant bias current source $CS_0$ and the variable level shift current sources $CS_2$ and $CS_3$. However, if the level shift circuit can be used for shifting at a constant level, the current sources $CS_2$ and $CS_3$ can be formed as constant current sources.

FIGS. 15 to 18 show circuit diagrams of embodiments of a level shift circuit in accordance with the present invention.

Figure 15:
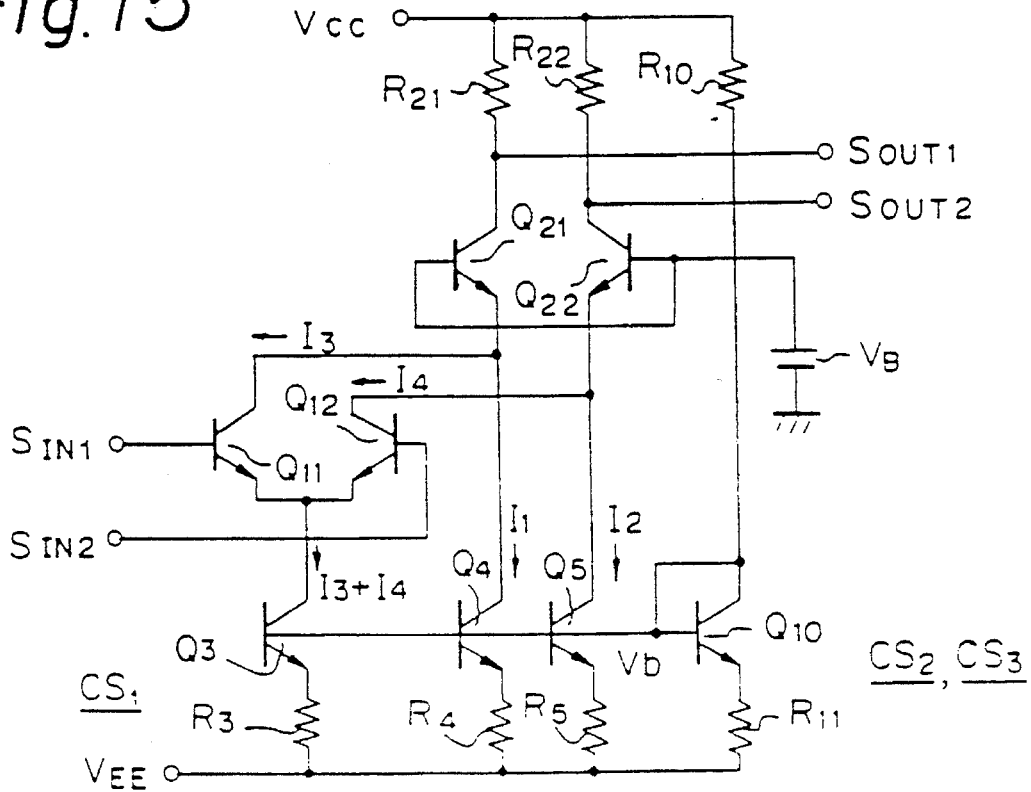
FIGS. 15, 16, 17 and 18 are circuit diagrams of embodiments of a level shift circuit in accordance with the present invention.

In FIG. 15, the constant current source $CS_1$ is composed of an npn-transistor $Q_3$ and a resistor $R_3$, and supplies a current corresponding to $(I_3+I_4)$. The current sources $CS_2$ and $CS_3$ are formed by a current-mirror type current source circuit consisting of npn-type transistors $Q_4$, $Q_5$, and $Q_{10}$, and resistors $R_4$, $R_5$, $R_{10}$, and $R_{11}$. The transistors $Q_4$ and $Q_5$ and the transistors $R_4$ and $R_5$ are defined to supply the current $I_1$ and $I_2$. In this embodiment, the current sources $CS_2$ and $CS_3$ are constant current sources, and the level shift is fixed.

Figure 16:
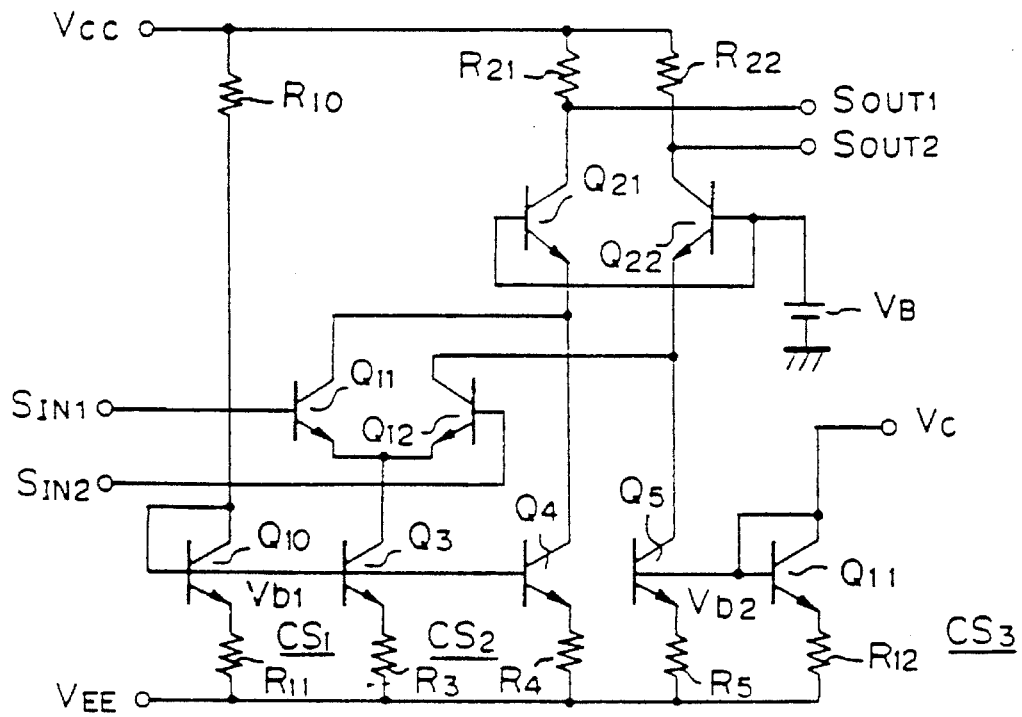

In FIG. 16, the current source $CS_l$ consists of a transistor $Q_3$ and a resistor $R_3$, the current source $CS_2$ consists of a resistor $R_{10}$, a transistor $Q_{10}$, a resistor $R_{11}$, a transistor $Q_4$, and a resistor $R_4$, and the current source $CS_3$ consists of transistors $Q_5$ and $Q_{11}$, and resistors $R_5$ and $R_{12}$. The current source $CS_2$ and the current source $CS_3$ are current-mirror type current sources. By changing a control voltage $V_C$ supplied to the current source $CS_3$, a level of an output signal $S_{OUT2}$ can be continuously changed. But, since the current source $CS_2$ is a constant current source, a level-shift of an output signal $S_{OUT1}$ is fixed.

Figure 17:
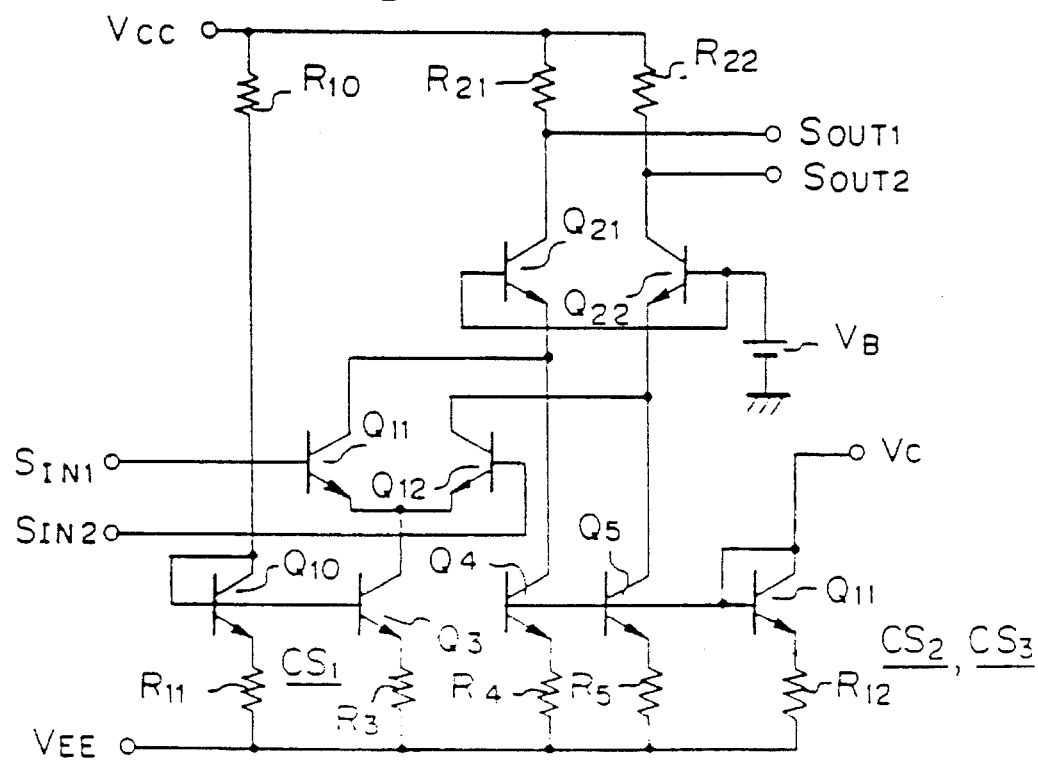

The level shift circuit shown in FIG. 17 is a modification of the level shift circuit shown in FIG. 16. In the drawing, the constant current source $CS_1$ is formed by a current-mirror type current source consisting of a resistor $R_{10}$, transistors $Q_{10}$ and $Q_3$, and resistors $R_{11}$ and $R_3$. The current sources $CS_2$ and $CS_3$ are formed by a variable current-mirror type current source consisting of transistors $Q_4$, $Q_5$, and $Q_{11}$ and resistors $R_4$, $R_5$ and $R_{12}$. By changing a control voltage $V_C$ supplied to the current sources $CS_2$ and $CS_3$, the levels of both of the output signals $S_{OUT1}$ and $S_{OUT2}$ can be continuously shifted.

Figure 18:
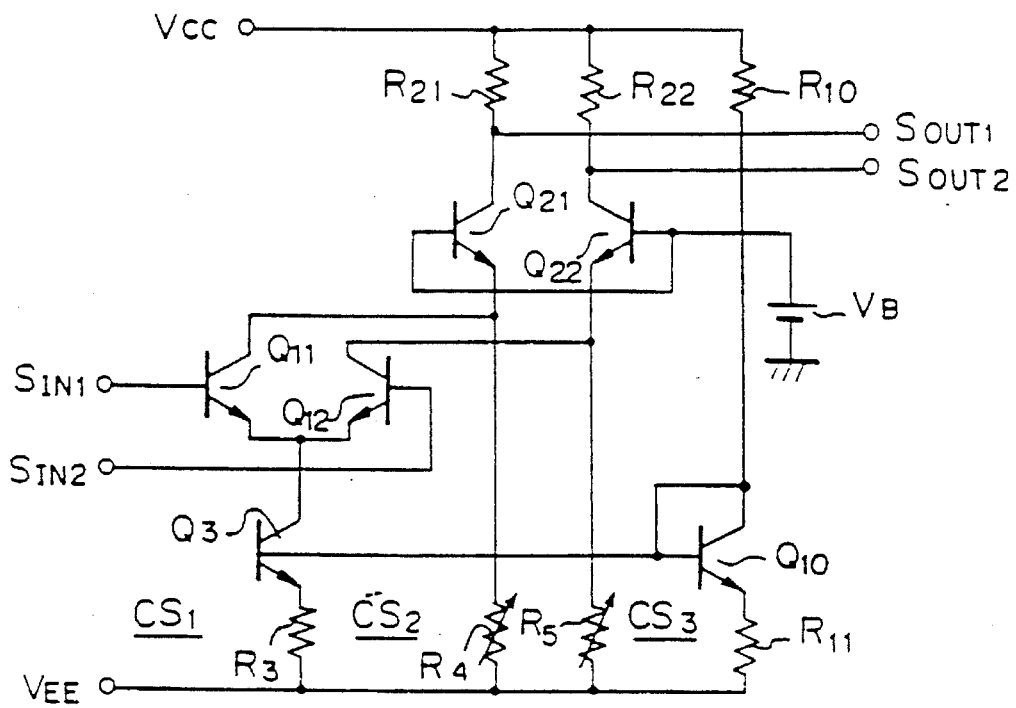

In FIG. 18, the constant current source $CS_1$ is formed by a current-mirror type current source consisting of transistors $Q_3$ and $Q_{10}$, and resistors $R_{10}$, $R_3$, and $R_{11}$. The current sources $CS_2$ and $CS_3$ are variable resistors $R_4$ and $R_5$. The levels of both of the output signals $S_{OUT1}$ and $S_{OUT2}$ can be freely shifted by adjusting the resistances of the resistors $R_4$ and $R_5$.

Third, a signal discrimination circuit of the present invention will be described.

Figure 19:
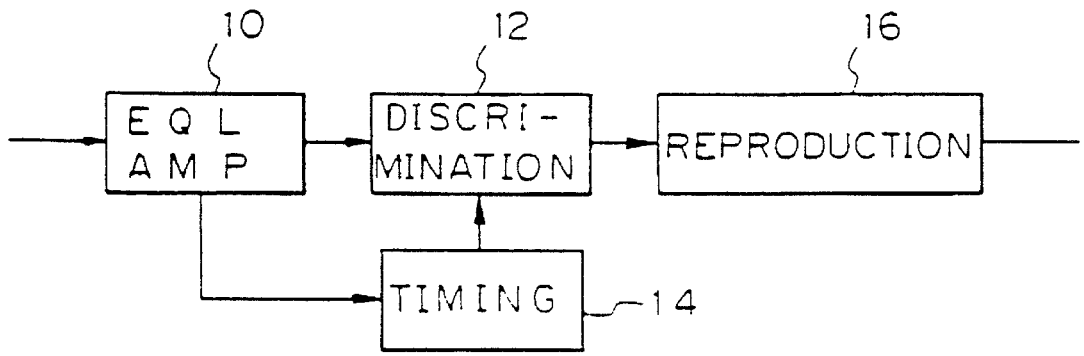
FIG. 19 is a block diagram of a signal discrimination circuit in accordance with the present invention.

The signal discrimination circuit can be applied, for example, to a repeater in an optical data transmission system. In the repeater, as shown in FIG. 19, an optical to electrical (OE) converted signal is equalized and amplified at an equalizing amplifier 10, and a clock signal is extracted at a timing circuit 14. The equalized signal is discriminated by a timing signal from the timing circuit 14 at a signal discrimination circuit 12, and the discriminated signal is reproduced at a reproduction circuit 16. As shown in FIG. 20, a discriminating level can be varied by adjusting a variable resistor $R_{VR}$. The equalizing amplifier 10 outputs an equalized signal S10A and a discriminating threshold voltage signal S10B. As shown in FIG. 21, the equalized signal S10A, having a distorted eye-pattern caused by an optical shock and a shifted timing, is discriminated by a threshold level L at the discrimination circuit 12. A high level signal is output when the equalized signal is higher than the threshold level L at a clock timing, and alternatively, a low level signal is output. In order to adjust the threshold level to a maximum level in response to variations, such as a drift of the circuit, or noise, the threshold level L is adjusted by the variable resistor $R_{VR}$, and the discrimination circuit 12 discriminates the equalized signal S10A by using the adjusted threshold level signal S10B.

In the optical transmission system, a very high speed signal processing is required. Such a high speed signal processing requires an improvement of a wave form response and a prevention of cross-talk. The improvement and the prevention, in general, require the system to reduce a gain at the equalizing amplifier, and to reduce an amplitude of the equalized signal. This amplitude reduction lowers the discrimination sensitivity.

In general, when an amplitude is small, and thus the discrimination sensitivity is low, the differential-operation type discrimination is preferable, but is difficult to adjust the discrimination level. Namely, since a normal polarity signal shown in FIG. 22a and an inverted polarity signal shown in FIG. 22b are used in the differential-operation discrimination, the discrimination threshold level L is determined at a center level. In the optical transmission system, a center of the eye-pattern tends to be shifted to a low level, and a free level shifting is required in the discrimination used by the differential-operation type circuit.

In addition, the differential-operation type circuit has an advantage in that a deadband of the discrimination defined by a low limit LL and an upper limit UL shown in FIG. 21 is reduced by a half.

The present invention provides a signal discrimination circuit which is formed by a differential-operation type circuit, operates at a high speed, has a high discrimination sensitivity, and can adjust the discrimination threshold level.

Figure 24:
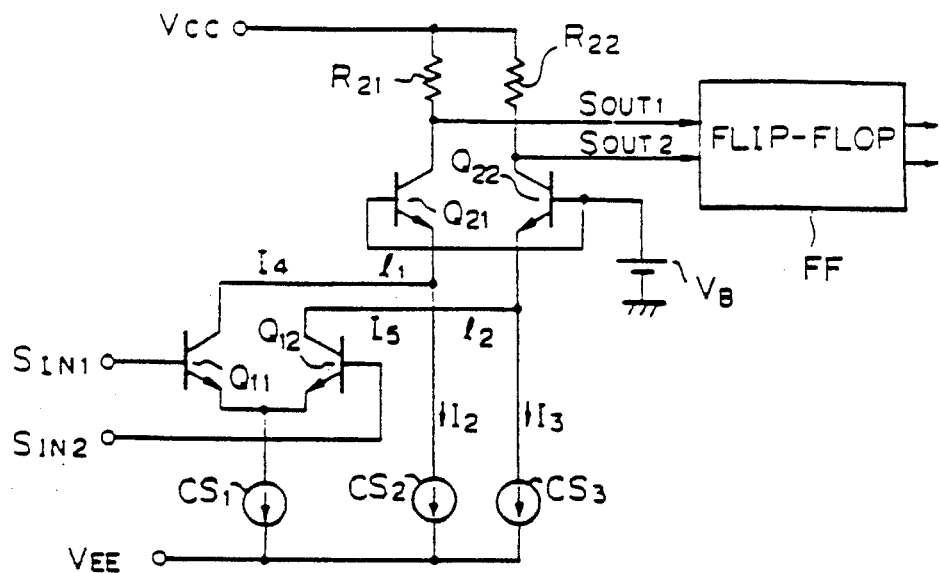
FIG. 24 is a circuit diagram showing the principle of a signal discrimination circuit of the present invention.

FIG. 24 shows a principle of the signal discrimination circuit in accordance with the present invention. A basic circuit configuration of the signal discrimination circuit shown in FIG. 24 is similar to the level shift circuit shown in FIG. 14, except that a flip-flop FF is provided. Accordingly, a description of the basic circuit configuration and operation thereof is omitted.

Currents $I_4$ and $I_5$, which are made to flow through load resistors $R_{21}$ and $R_{22}$, load transistors $Q_{21}$ and $Q_{22}$, a pair of differential-operation transistors $Q_{11}$ and $Q_{12}$ and a current source $CS_1$, respectively, are varied in response to input signals $SIN_1$ and $S_{IN2}$. These currents $I_4$ and $I_5$ generate voltage drops defined by $(R_{21}\ I_4)$ and $(R_{22}\ I_5)$ at the load resistors $R_{21}$ and $R_{22}$. In addition, currents $I_2$ and $I_3$, which respectively flow through the load resistors $R_{21}$ and $R_{22}$, the load transistors $Q_{21}$ and $Q_{22}$, and current sources $CS_2$ and $CS_3$, are defined by only the current sources $CS_2$ and $CS_3$ and generate voltage drops defined by $(R_{21}\ I_2)$ and $(R_{22}\ I_3)$. These voltage drops $(R_{21}\ I_2)$ and $(R_{22}\ I_3)$ indicate shift levels. Referring to FIGS. 23a and 23b, a level $SL_L$ or a level $SL_U$ is shifted by $(R_{21}\ I_2-R_{22}\ I_3)/2$ from the discrimination threshold level L. The level shifted output signals $S_{OUT1}$ and $S_{OUT2}$ are output to the flip-flop FF.

The current sources $CS_2$ and/or $CS_3$ are formed to supply variable currents $I_2$ and $I_3$ in response to a level shift value.

In the signal discrimination circuit shown in FIG. 24, all of the features of the level shift circuit shown in FIG. 14 are maintained.

Figure 25:
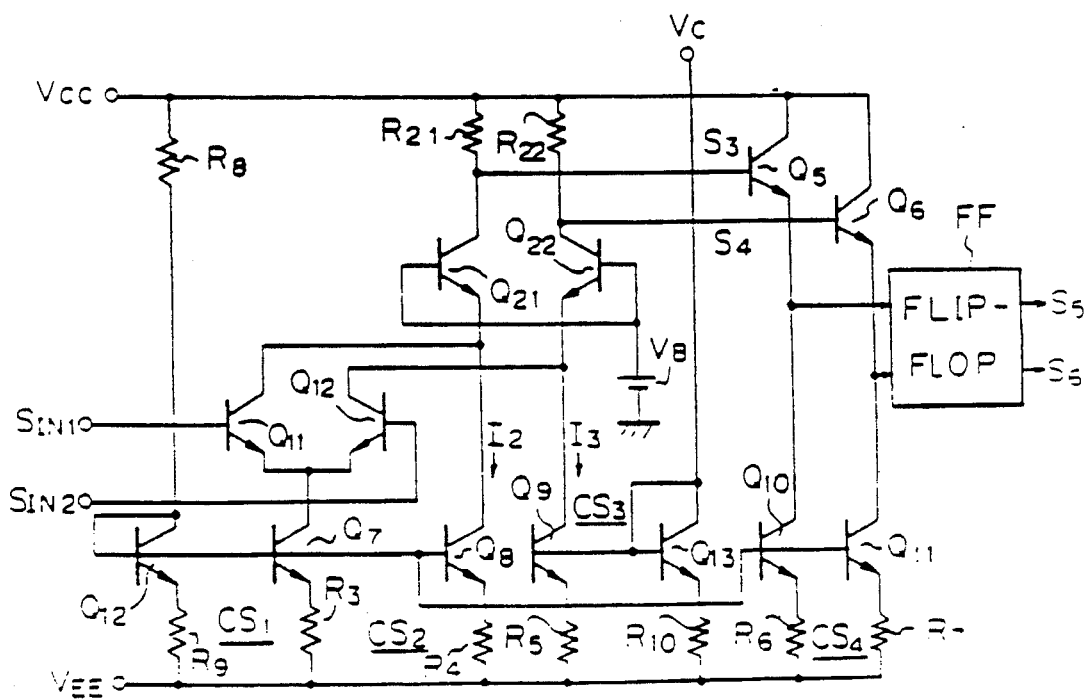
FIGS. 25, 26 and 27 are circuit diagrams of embodiments of the signal discrimination circuit in accordance with the present invention.

FIG. 25 shows a specific circuit diagram of an embodiment of the signal discrimination circuit in accordance with the present invention. In FIG. 25, emitter-follower transistors $Q_5$ and $Q_6$ are provided to output signals $S_3$ and $S_4$ therethrough. The constant current source $CS_1$ is formed by a current-mirror type current source circuit consisting of transistors $Q_{12}$ and $Q_7$ and resistors $R_8$, $R_9$ and $R_3$. The current source $CS_2$ is formed by a current-mirror type current source circuit consisting of a transistor $Q_8$, a resistor $R_4$, the common resistors $R_8$ and $R_9$, and the common transistor $Q_{12}$. The current source $CS_3$ is formed by a current-mirror type current source circuit consisting of transistors $Q_9$ and $Q_{13}$ and resistors $R_5$ and $R_{10}$. A current source $CS_4$ for the emitter-follower transistors $Q_5$ and $Q_6$ is formed by a current-mirror type current source circuit consisting of transistors $Q_{10}$ and $Q_{11}$, resistors $R_6$ and $R_7$, the common resistor $R_8$, the common transistor $Q_{12}$ and the common resistor $R_9$.

In the drawing, the current source $CS_3$ can change the current $I_3$ by adjusting a control voltage $V_C$, and can shift the level of the signal $S_4$. The current source $CS_3$ supplies a constant current $I_2$, and accordingly, the shift level of the signal $S_3$ is constant. FIGS. 23a and 23b show the level shift by the circuit shown in FIG. 25, and the signal discrimination therefor.

Figure 26:
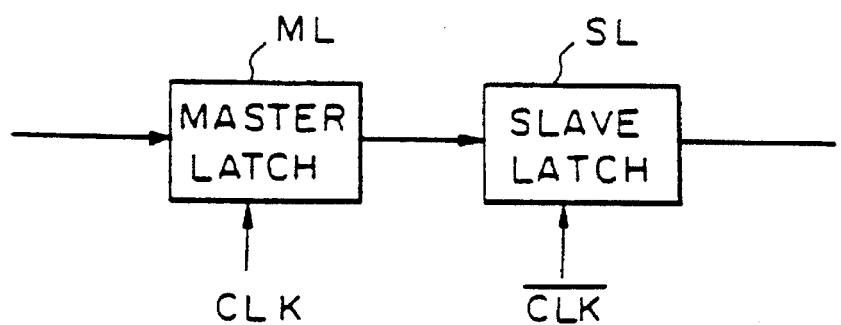

FIG. 26 shows a block diagram of an embodiment of the flip-flop FF shown in FIG. 24. The flip-flop FF includes a master latch circuit ML driven by a clock CLK, and a slave latch circuit SL driven by an inverted clock CLK.

Figure 27:
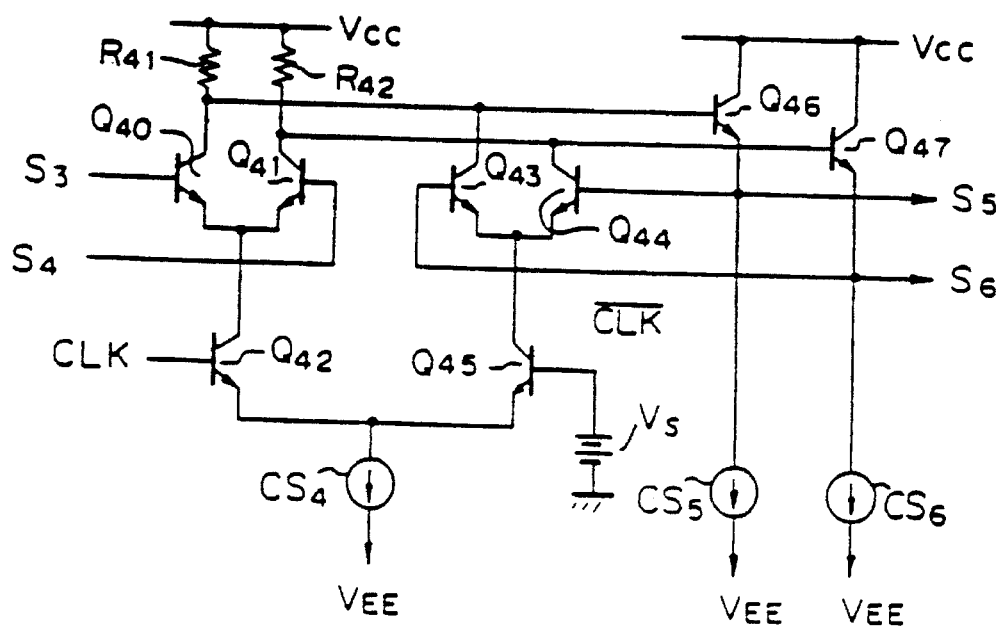

FIG. 27 shows a specific circuit diagram of the flip-flop FF shown in FIG. 26. In the drawing, reference $V_S$ denotes a reference voltage supply, $CS_4$ to $CS_6$ denote current sources. The operation will be briefly described. When the signal $S_3$ is higher than the signal $S_4$, and when the clock CLK is at a high level higher than a voltage from the reference voltage supply $V_S$, a transistor $Q_{40}$ is turned ON, a transistor $Q_{41}$ is turned OFF, a transistor $Q_{46}$ is turned OFF and a transistor $Q_{47}$ is turned ON thus outputting a signal $S_5$ having a low level and a signal $S_6$ having a high level. Also, a transistor $Q_{43}$ is turned ON, a transistor $Q_{44}$ is turned OFF, and a transistor $Q_{45}$ is turned OFF. When the clock CLK becomes low level, the transistor $Q_{42}$ is turned OFF, the transistor $Q_{45}$ is turned ON, the transistor $Q_{43}$ is turned ON, and the transistor $Q_{44}$ is turned OFF, and thus the signal $S_5$ is maintained at a high level and the signal $S_6$ at a low level. That is, a latch function is achieved. The above latched statuses are updated in response to the levels of the input signals $S_3$ and $S_4$ when the clock CLK becomes high level. Accordingly, the flip-flop FF shown in FIG. 27 functions as a discrimination circuit which reads data in response to the levels of the input signals $S_3$ and $S_4$ at a change time of the clock CLK, with a narrow pulse width of the clock CLK.

Referring to FIG. 25, since the level shift of the signal $S_3$ is constant and the level of the signal $S_4$ is shifted, the discrimination threshold level L is shifted by a half (½) of the level shift of the signal $S_4$. Also, the dead band of the discrimination shown in FIG. 21 is narrowed by a half.

Referring to FIGS. 19, 20 and 25, the signals S10A and S10B correspond to the input signals $S_{IN1}$ and $S_{IN2}$, and the circuit shown in FIG. 25 including the flip-flop FF corresponds to the signal discrimination circuit 12. The clock CLK in FIG. 27 is supplied from the timing circuit 14 shown in FIG. 19.

As described above, the signal discrimination circuit of the present invention is formed by a combination of the level shift circuit, which is differential-operated and can shift the levels of the differential-input signals $S_{IN1}$ and $S_{IN2}$, and a latch circuit, such as the flip-flop FF, latching the level-shifted output signals $S_{OUT1}$ and $S_{OUT2}$. The signal discrimination circuit of the present invention can adjust the discrimination threshold level L and has a narrow dead band. The narrow dead band brings a reduction of an amplitude of the equalized signal, resulting in a prevention of cross-talk. In addition, since all of the features of the level shift circuit shown in FIG. 14 are maintained, the signal discrimination circuit of the present invention can operate at a high speed while improving the frequency characteristic and the wave form response characteristic. In particular, the signal discrimination circuit is preferably used for discriminating the OE converted signal because the free level shift is effective for discriminating a center eye-pattern lowered due to an optical shock.

Fourth, a signal distribution circuit of the present invention will be described.

Figure 28:
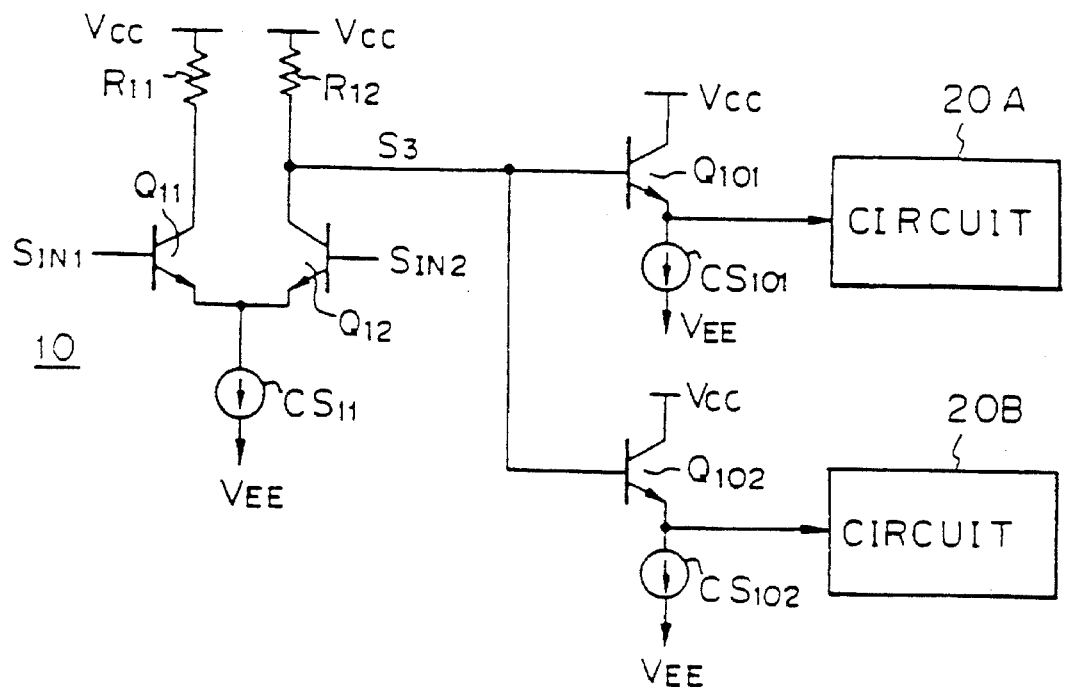
FIGS. 28 and 29 are circuit diagrams of prior art signal distribution circuits.

FIG. 28 shows a prior art signal distribution circuit. In the drawing, a signal sending circuit 10 is a differential-operation pair type circuit consisting of resistors $R_{51}$ and $R_{52}$, transistors $Q_{51}$ and $Q_{52}$ and a constant current source $CS_{51}$. Two parallel-connected emitter-follower circuits, which consist of a transistor $Q_{101}$ and a constant current source $CS_{101}$, and a transistor $Q_{102}$ and a constant current source $CS_{102}$, respectively, are connected to a collector of the transistor $Q_{52}$. Two circuits 20A and 20B, which receive distributed signals follow the emitter-follower circuits. When receipt of two input signals $S_{IN1}$ and $S_{IN2}$, one of which may be a reference signal, a difference between the two input signals $S_{IN1}$ and $S_{IN2}$ is amplified and output as an output signal $S_3$. The output signal $S_3$ is supplied to bases of the transistors $Q_{101}$ and $Q_{102}$, and output signals, each of which is lowered by a base-emitter voltage $V_{BE}$ of each of the transistors $Q_{101}$ and $Q_{102}$, are supplied to the circuits 20A and 20B.

In FIG. 28, since the base-emitter capacitors (not shown) are connected to the resistor $R_{52}$ in parallel, a frequency characteristic of the signal distribution circuit is distorted. In addition, the input impedance of the circuits 20A and 20B adversely effects a voltage drop at the resistor $R_{52}$. As a result, the signal distribution circuit does not have sufficient fan-outs.

Figure 29:
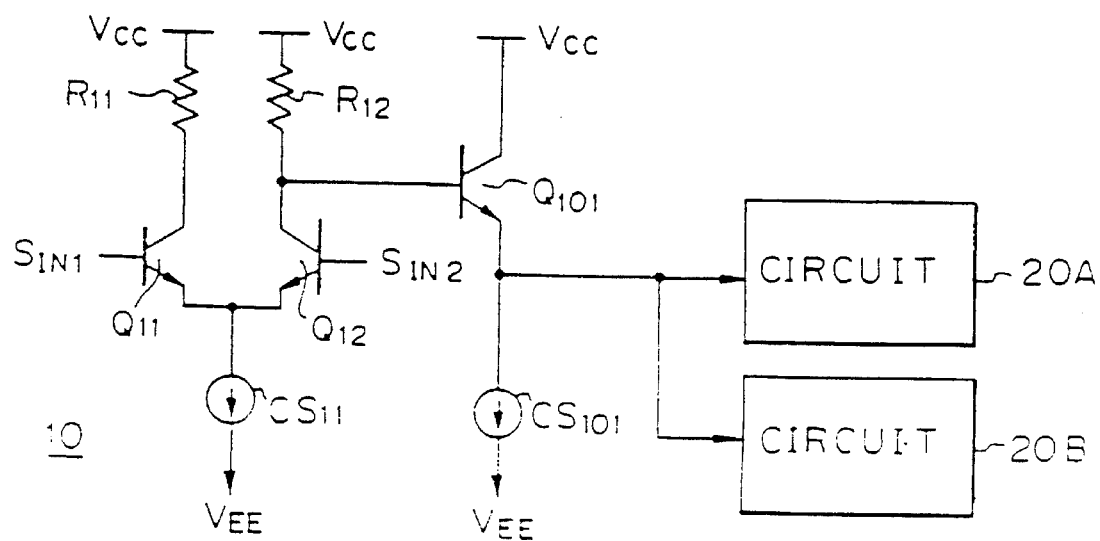

FIG. 29 also shows a prior art signal distribution circuit. In the drawing, a single emitter-follower circuit consisting of the transistor $Q_{101}$ and the constant current source $CS_{101}$ is provided to supply two distributed signals to the circuits 20A and 20B. Since the input impedance of the circuits 20A and 20B are connected to an output terminal of the emitter-follower transistor $Q_{101}$, the frequency characteristic often may fluctuate. In addition, the mutual status change of the circuits 20A and 20B adversely effects the signal distribution circuit. Also, this signal distribution circuit does not provide sufficient fan-outs.

Figure 30:
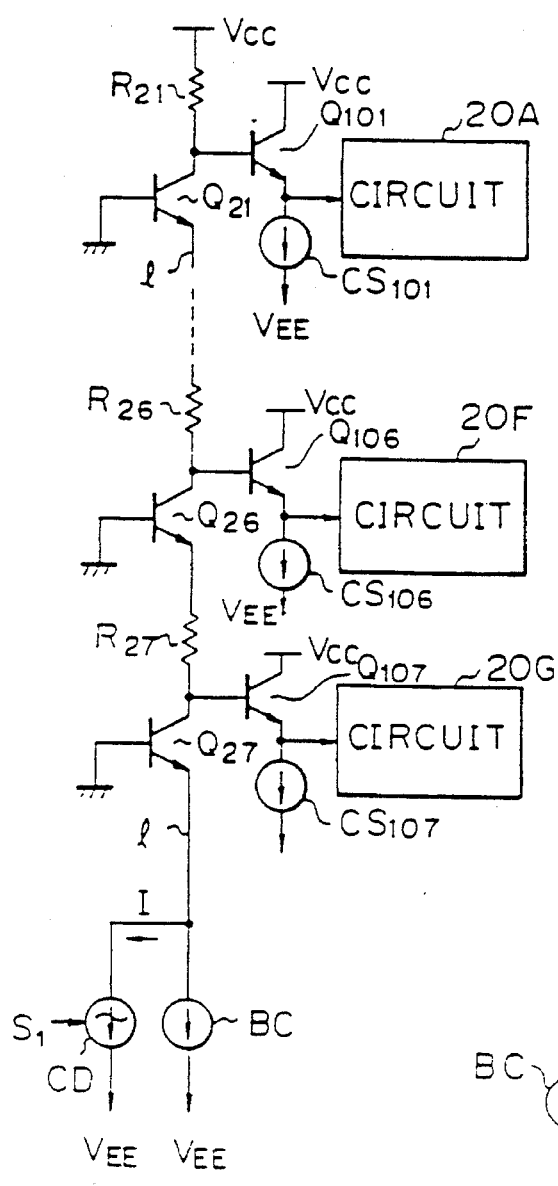
FIGS. 30 and 31 are circuit diagrams showing the principle of signal distribution circuits in accordance with the present invention.
Figure 31:
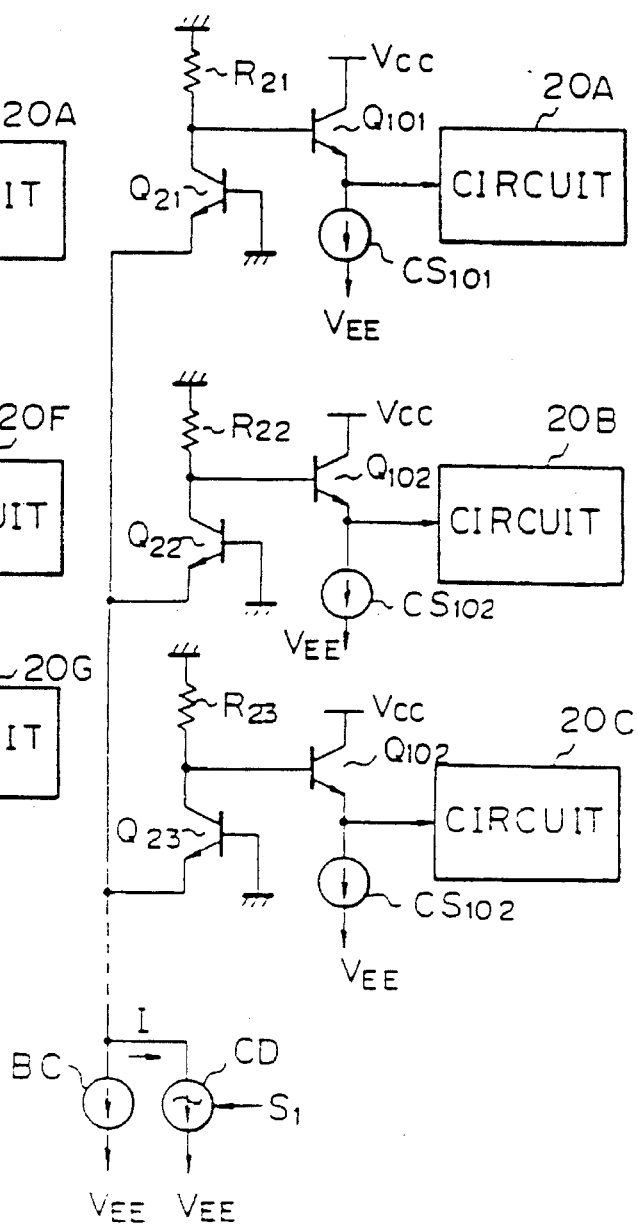

FIGS. 30 and 31 are circuit diagram showing the principle of the signal distribution circuits in accordance with the present invention.

The signal distribution circuit shown in FIG. 30 includes a current drive source ID having at least one transistor, an emitter of which is operatively grounded and a base of which receives an input signal $S_{IN}$, and series-connected base-grounded transistor circuits, for example, a base-grounded transistor circuit composed of a base-grounded transistor $Q_{21}$ and a resistor $R_{21}$. An emitter of each base-grounded transistor circuit is operatively connected to a collector of the transistor in the current drive source ID. Accordingly, the above circuit configuration is formed as a cascode configuration. In addition, a bias current source BC is connected between each emitter of the base-grounded transistor, for example, $Q_{27}$ and ground.

In addition, as an option, a plurality of emitter-follower circuits, each, for example, an emitter-follower circuit composed of an emitter-follower transistor $Q_{101}$ and a current source $CS_{101}$, can be connected to collectors of the base-grounded transistors. The circuits 20A to 20G are also connected to the emitter-follower circuits.

The signal distribution circuit shown in FIG. 30 changes the voltage input signal $S_{IN}$ to a current signal I passing through the series-connected base-grounded transistor circuits. Each voltage drop generated at each load resistor, for example, $R_{21}$, is supplied to the base of a corresponding emitter-follower transistor, for example, $Q_{101}$, to distribute the input signal $S_{IN}$.

In the drawing, since the emitter-follower circuits and the circuits 20A to 20G do not distribute the signals, the frequency characteristic is not distorted and the adverse effect due to the circuits 20A to 20G is avoided. In addition, the load resistors are separated by the base-grounded transistors, and thus the frequency characteristic is not adversely effected by the stray capacitors. Furthermore, by providing the bias current source BC, the adverse effect due the stray capacitance superimposed on the voltage of the transfer lines 1 is fully eliminated. As a result, the signal distribution circuit shown in FIG. 30 operates at a high speed without a distortion of the frequency characteristic and the wave form response characteristic, and can provide many fan-outs regardless of the superimposition of the stray capacitance.

The signal distribution circuit shown in FIG. 31 includes the current drive source ID, parallel-connected base-grounded transistor circuits, and the bias current source BC. Optionally, a plurality of emitter-follower circuits and the circuits 20A to 20C are provided. The operation of the signal distribution circuit is similar to that of the signal distribution circuit shown in FIG. 30. The features of the signal distribution circuit shown in FIG. 31 are also similar to those of the signal distribution circuit shown in FIG. 30.

Comparing the signal distribution circuits shown in FIGS. 30 and 31, in the signal distribution circuit shown in FIG. 30, a high voltage $V_{CC}$ is higher than that of the signal distribution circuit shown in FIG. 31, and the amplitudes of the distributed signals are the same. Conversely, in the signal distribution circuit shown in FIG. 31, each amplitude of the distributed signals is 1/n, where n represents the number of base-grounded transistor circuits.

FIGS. 32 to 37 show circuit diagrams of embodiments of the signal distribution circuits shown in FIGS. 30 and 31.

Figure 32:
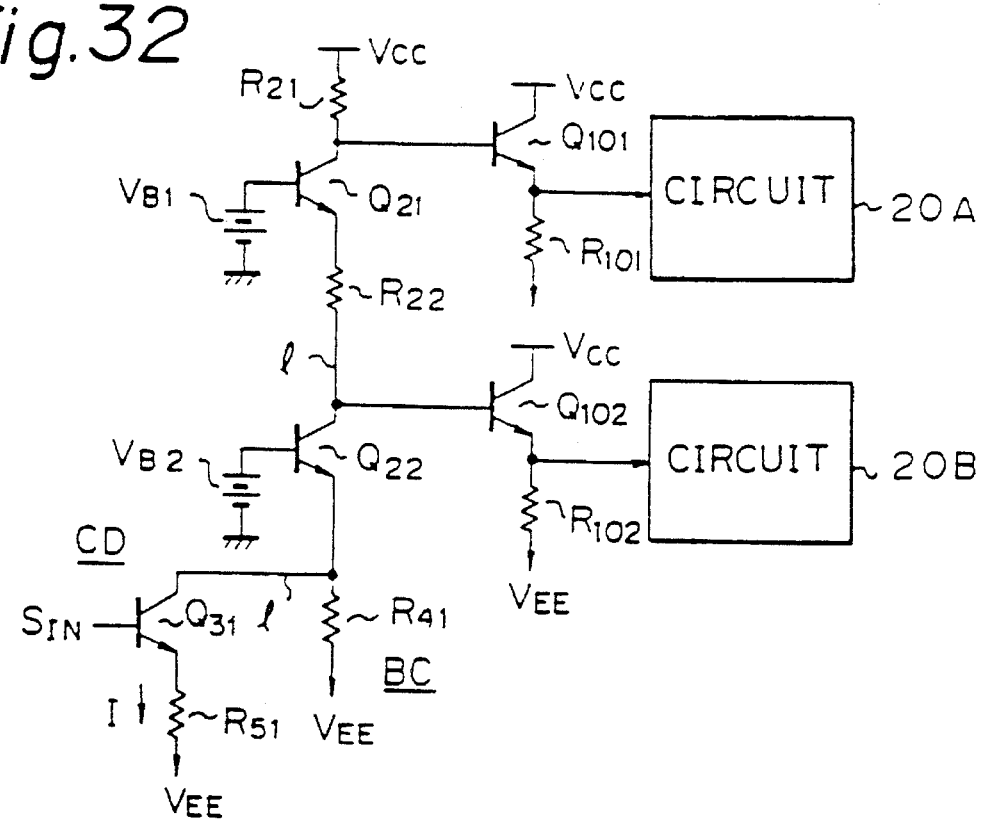
FIGS. 32, 33, 34, 35, 36, and 37 are circuit diagrams of embodiments of signal distribution circuits in accordance with the present invention.
Figure 33:
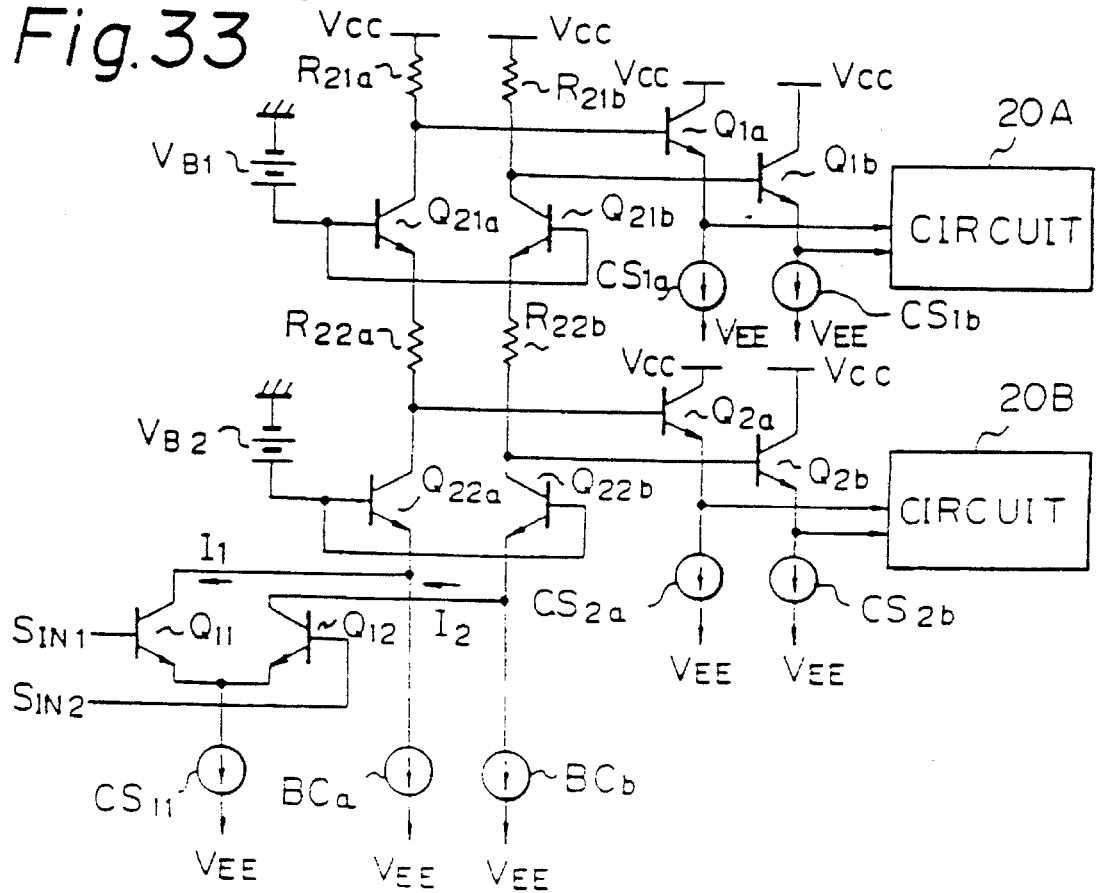

The signal distribution circuits shown in FIGS. 32 and 33 correspond to the signal distribution circuit shown in FIG. 30. The bases of base-grounded transistors $Q_{21}$, $Q_{22}$, $Q_{21a}$, $Q_{21b}$, $Q_{22a}$ and $Q_{22b}$ are grounded through bias voltage supply circuits $V_{B1}$ and $V_{B2}$. Emitters of transistors $Q_{31}$, $Q_{11}$, and $Q_{12}$ are grounded through a resistor $R_{S1}$ functioning as the current source and a current source $CS_{11}$. In FIG. 32, the bias current source BC is formed by a resistor $R_{41}$. Since the signal distribution circuit shown in FIG. 33 is differentially operated, two bias current sources $BC_a$ and $BC_b$ are provided.

Figure 34:
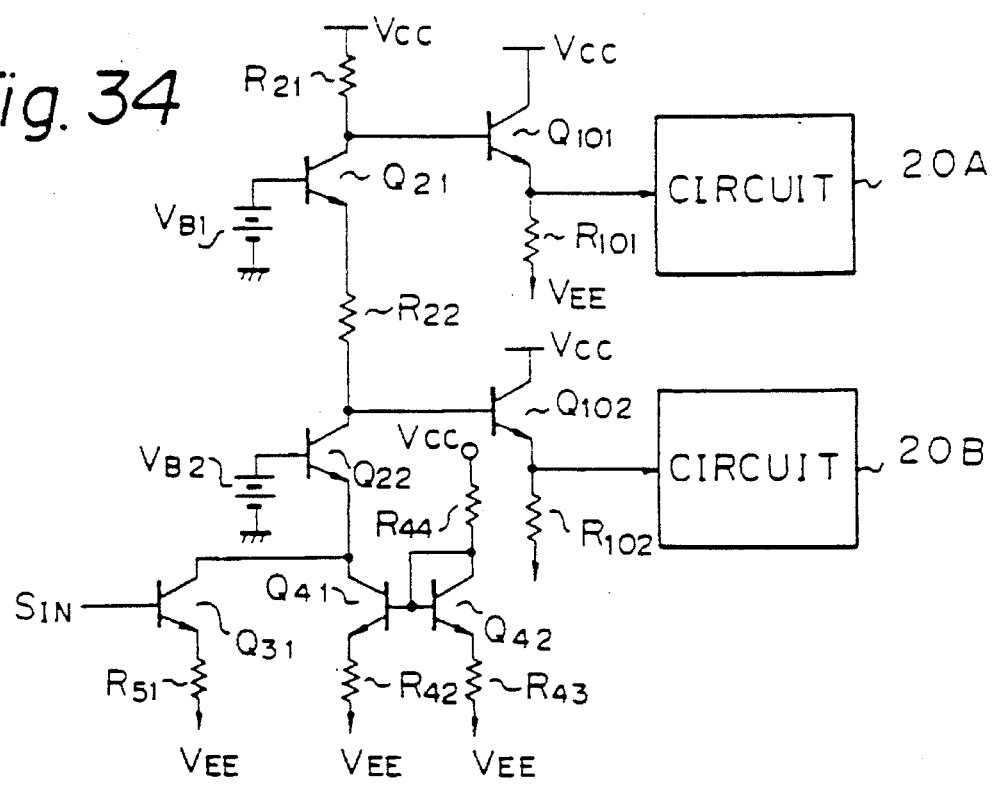
Figure 35:
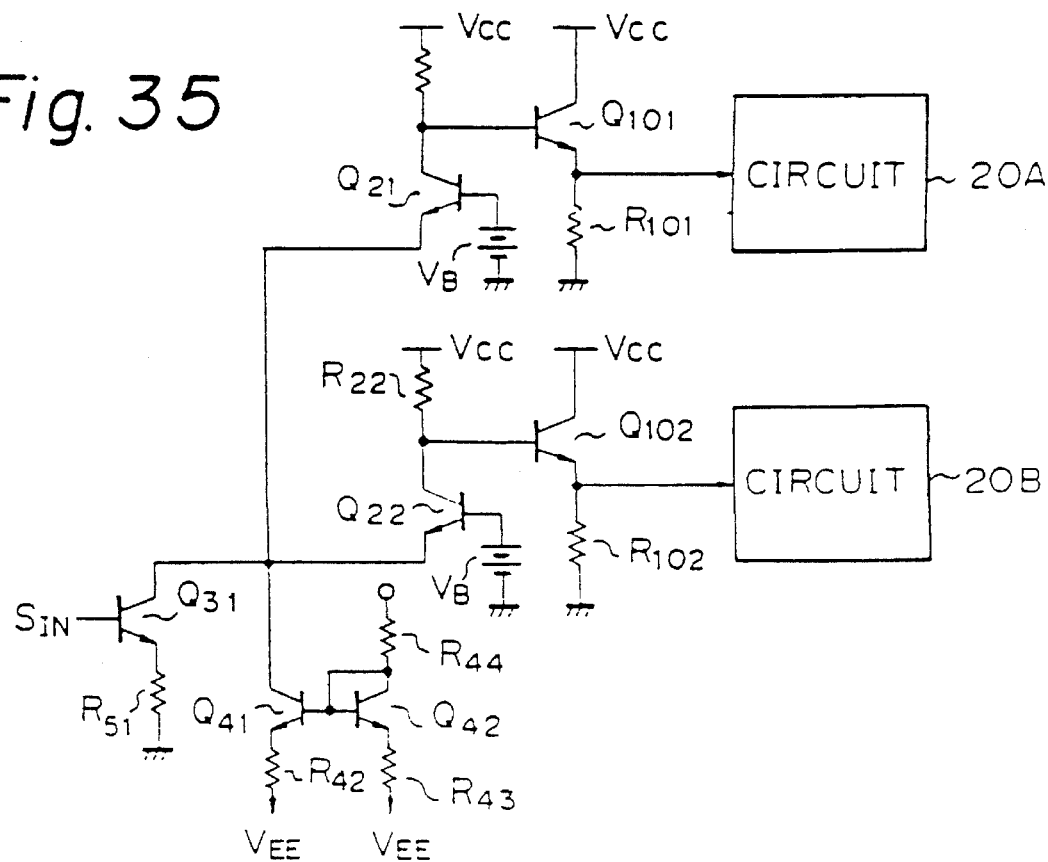
Figure 36:
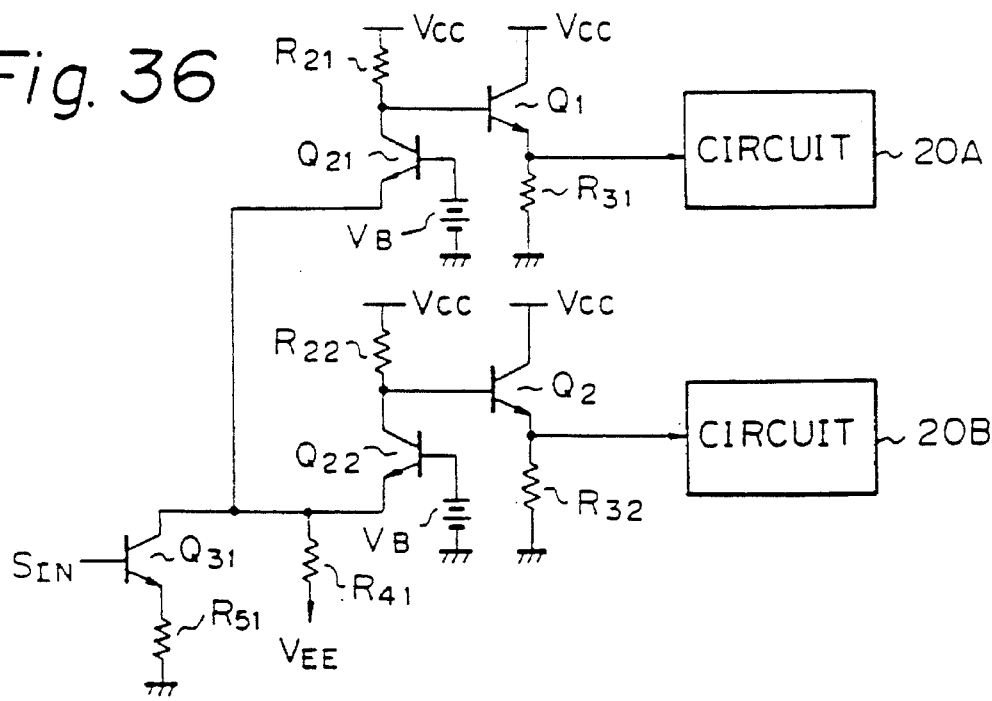
Figure 37:
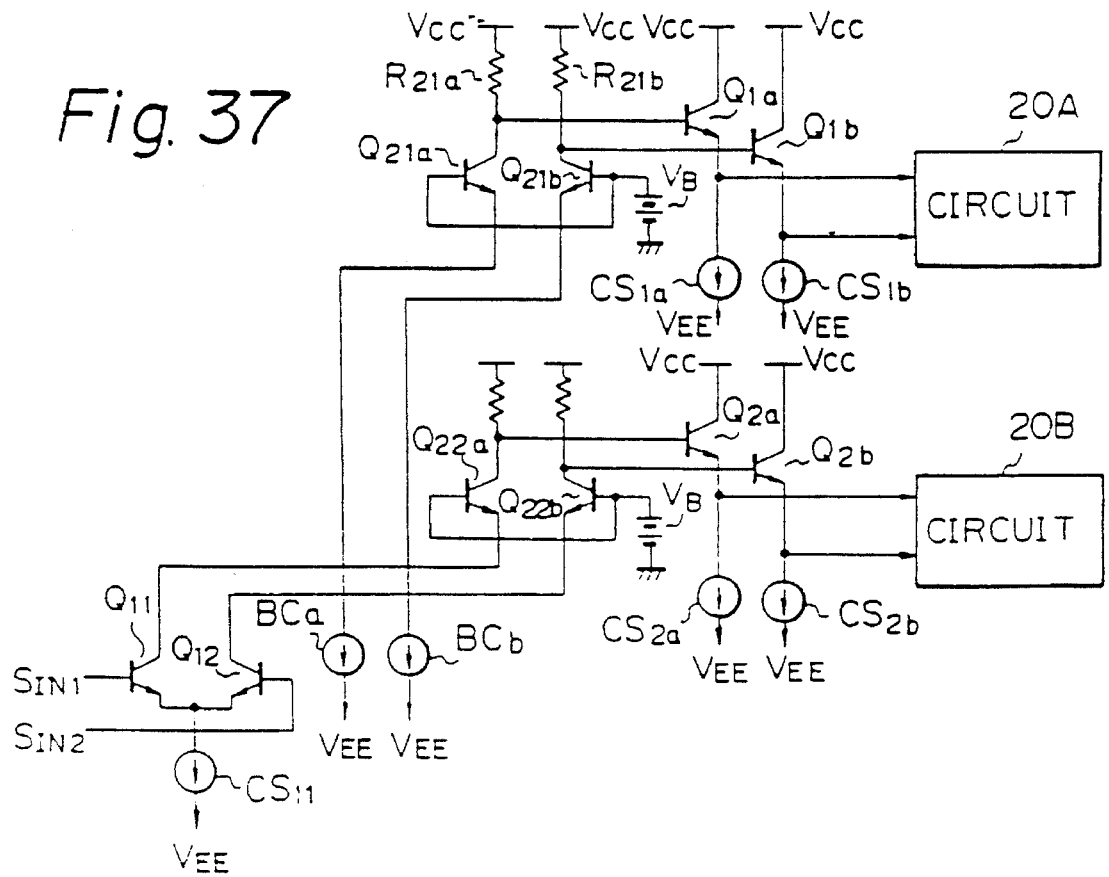

The signal distribution circuits shown in FIGS. 36 to 37 correspond to the signal distribution circuit shown in FIG. 31. In FIGS. 34 and 35, the bias current source BC is formed by a current-mirror type current source circuit. The signal distribution circuit shown in FIG. 37 is differentially operated.

Fifth, a signal synthesization circuit of the present invention will be described.

Figure 38:
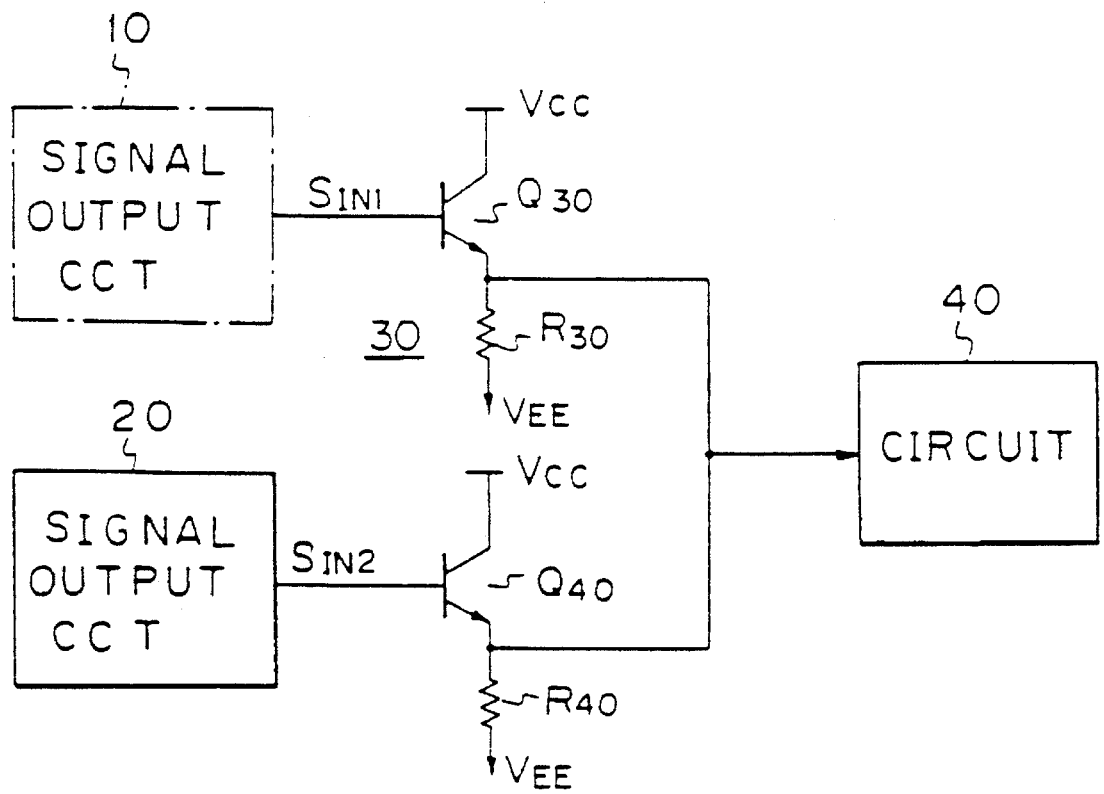
FIGS. 38 and 39 are circuit diagrams of prior art signal synthesization circuits.
Figure 39:
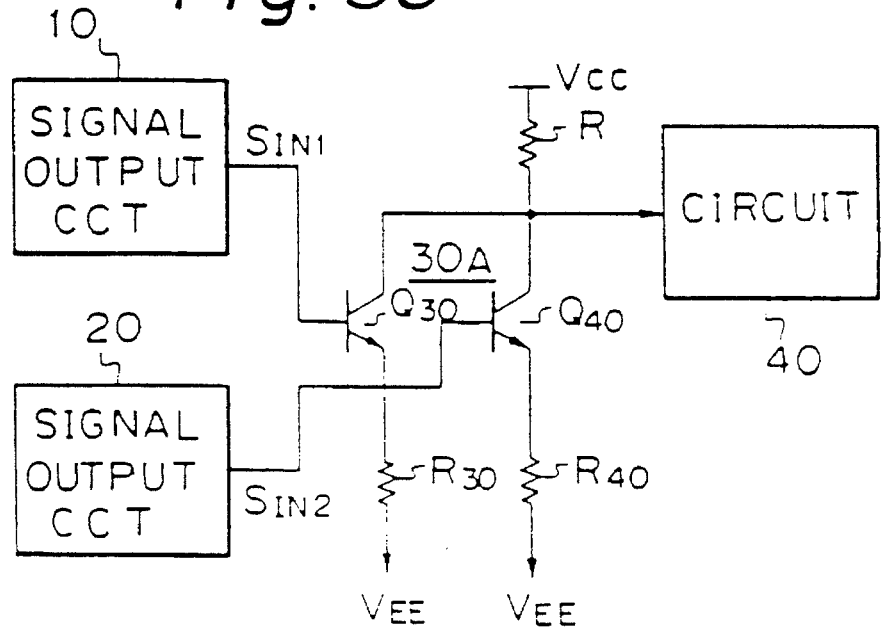

FIGS. 38 and 39 show prior art signal synthesization circuits. The operation of these signal synthesization circuits is well known, and thus a description thereof is omitted. In the signal synthesization circuit shown in FIG. 38, emitter-follower outputs of transistors $Q_{30}$ and $Q_{40}$ are connected to a circuit 40. The signal synthesization circuit shown in FIG. 38 suffers from the same defects as those of the signal distribution shown in FIG. 29. Also, the signal synthesization circuit shown in FIG. 39 suffers from defects similar to those of the signal distribution circuit shown in FIG. 28, since base-collector capacitors of transistors $Q_{30}$ and $Q_{40}$ are connected to a load resistor R in parallel.

In particular, a signal synthesization circuit of the present invention overcomes the above defects of the load resistor commonly used type signal synthesization circuit shown in FIG. 39.

Figure 40:
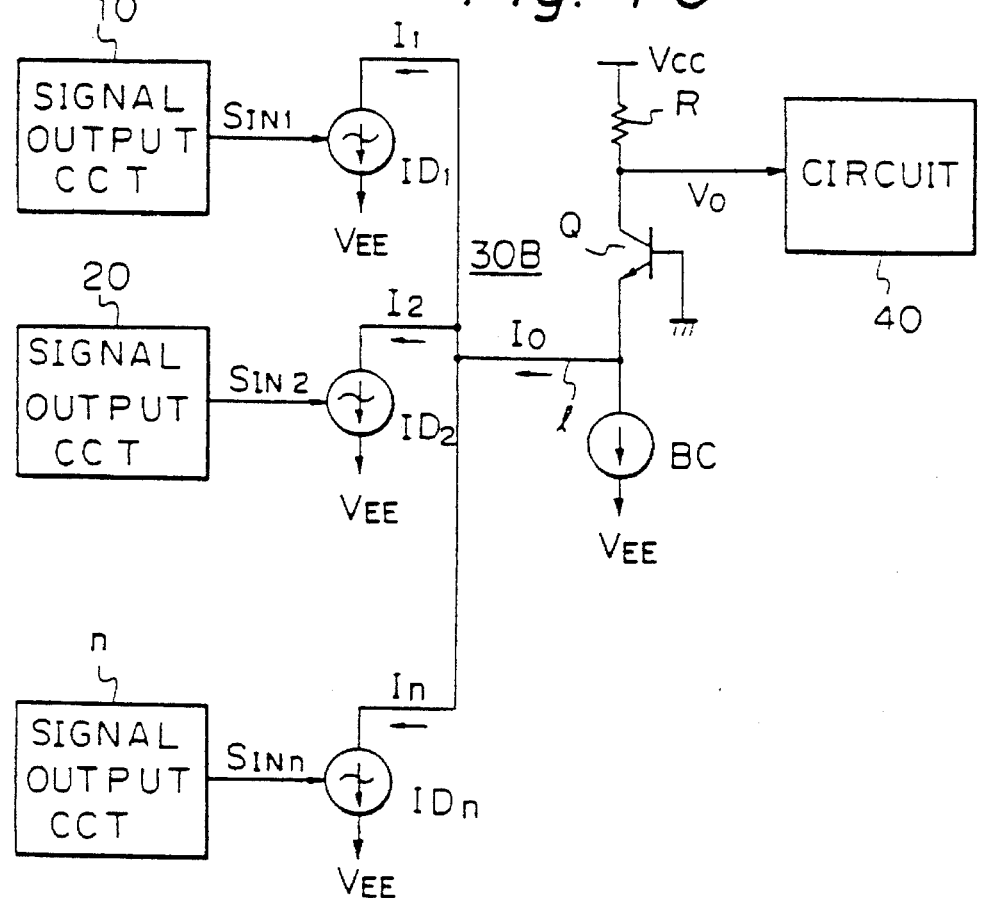
FIG. 40 is a circuit diagram showing the principle of a signal synthesization circuit in accordance with the present invention.

FIG. 40 shows a circuit diagram showing the principle of a signal synthesization circuit in accordance with the present invention. The signal synthesization circuit includes a plurality current drive sources $ID_1$ to $ID_n$ provided in correspondence to the number of input signals $S_{IN1}$ to $S_{INn}$ to be synthesized, a base-grounded transistor Q, a load resistor R, and a bias current source BC. Each current drive source ID includes a transistor, an emitter thereof being operatively grounded, and a base thereof receiving the input signal $S_{IN}$. As is apparent, the signal synthesization circuit is basically formed by a combination of the cascode configuration circuit and the current source BC.

In the FIG. 40, the current drive circuits $ID_1$ to $ID_n$ change the voltage input signals $S_{IN1}$ to $S_{INn}$ to current signals $I_1$ to $I_n$, and the current signals $I_1$ to $I_n$ are synthesized at a common connected point as $I_0=I_1+I_2+ \ldots +I_n$. The synthesized current signal $I_0$ is changed to a voltage $V_0$ at the load resistor R. This voltage $V_0$ is supplied to a circuit 40.

Since the base-grounded transistor Q separates a connection between the current drive sources $ID_1$ to $ID_n$ and the load resistor R, the adverse effect due to a stray capacitance on the current drive sources $ID_1$ to $ID_n$ is prevented. In addition, since output impedances of the current drive sources $ID_1$ to $ID_n$ are high, a mutual interface between the current drive sources $ID_1$ to $ID_n$ is substantially avoided. Furthermore, the provision of the bias current source BC eliminates the adverse effect due to the stray capacitor connected to the transfer line 1. As a result, the signal synthesization circuit shown in FIG. 40 provides many fan-ins, and operates at a high speed without a distortion of the frequency characteristic.

Figure 41:
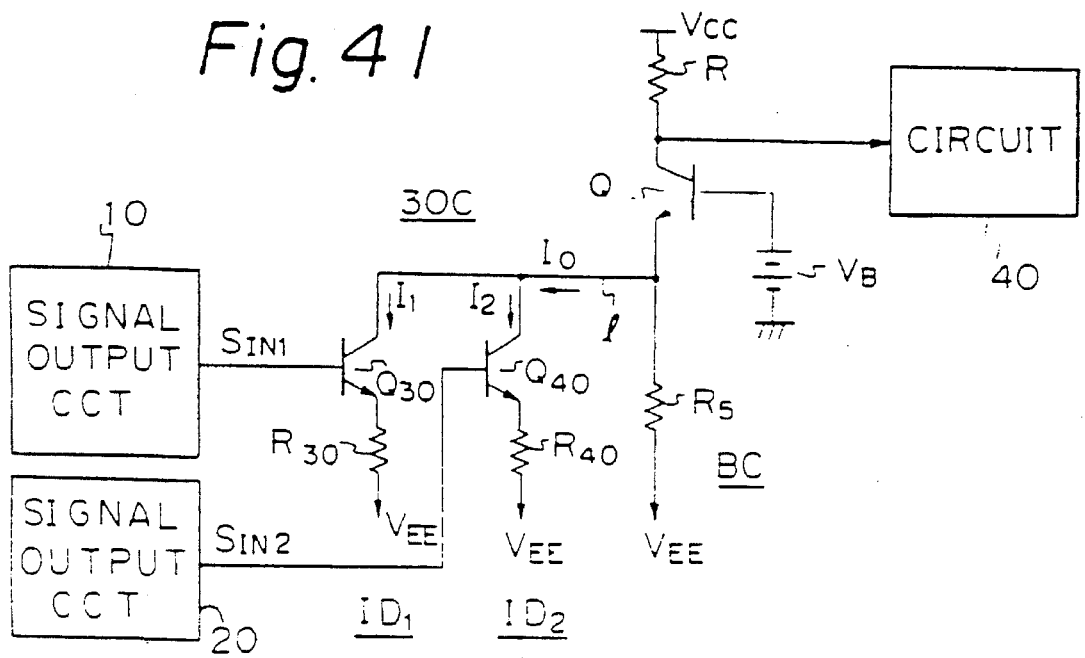
FIGS. 41, 42 and 43 are circuit diagrams of embodiments of a signal synthesization circuit in accordance with the present invention.
Figure 42:
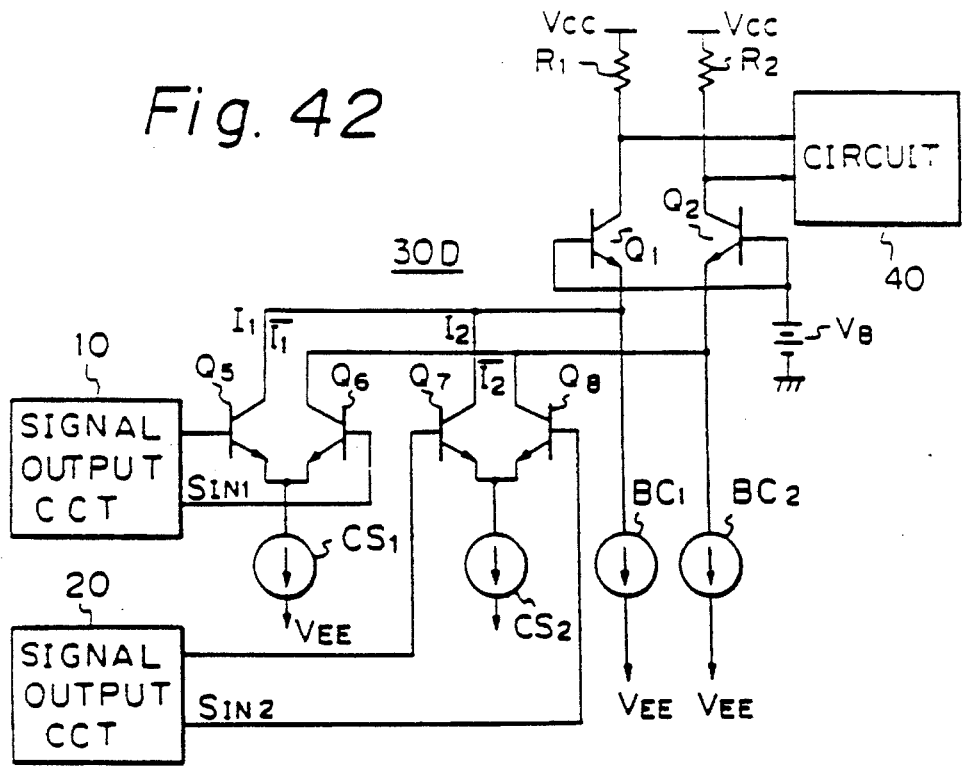
Figure 43:
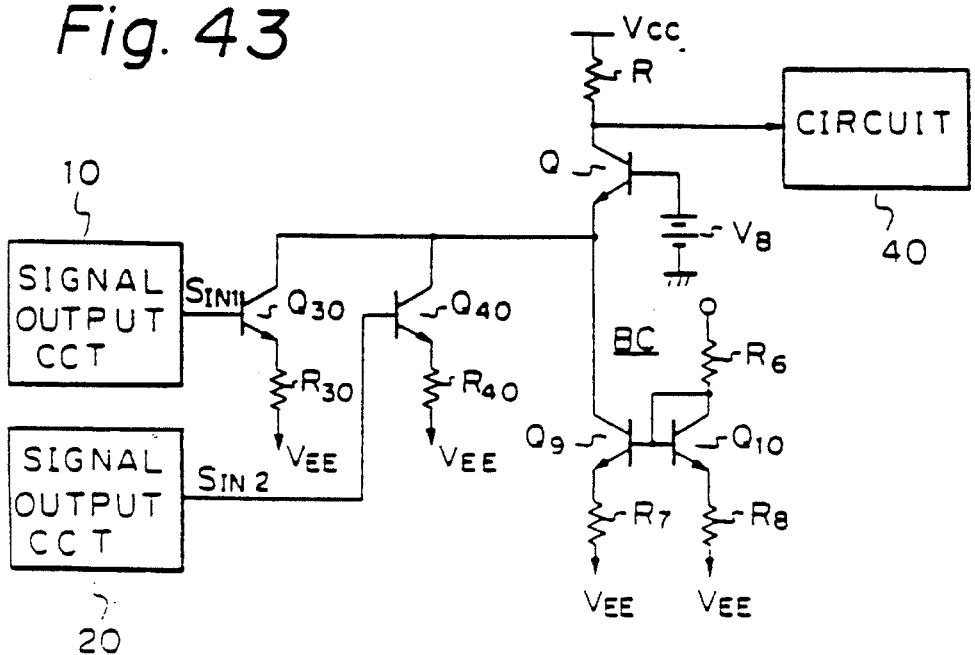

FIGS. 41 to 43 show circuit diagrams of embodiments of the signal synthesization circuit in accordance with the present invention. The configuration and the operation of these signal synthesization circuits are apparent from the above description.

Sixth, a frequency band control and amplification circuit of the present invention will be described.

Figure 44:
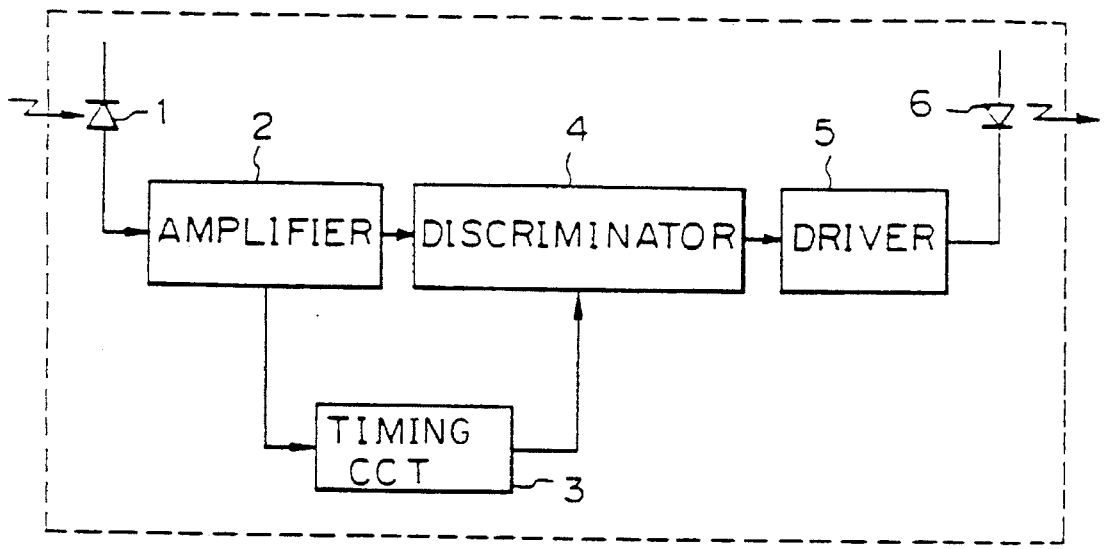
FIG. 44 is a block diagram of an optical repeater.

FIG. 44 shows a block diagram of a repeater in an optical data transmission system. In FIG. 44, reference 1 denotes an optical signal to electric (OE) signal converter, 2 denotes an amplifier, 3 denotes a timing circuit, 4 denotes a discriminator, 5 denotes a signal driver, and 6 denotes a laser. The repeater is similar to the repeater shown in FIG. 19. To improve a S/N, a frequency band control amplification circuit which controls a frequency band is, provided in the amplifier 2. Also, to suppress a ringing, a frequency band control circuit is also provided in the timing circuit 3.

Figure 45:
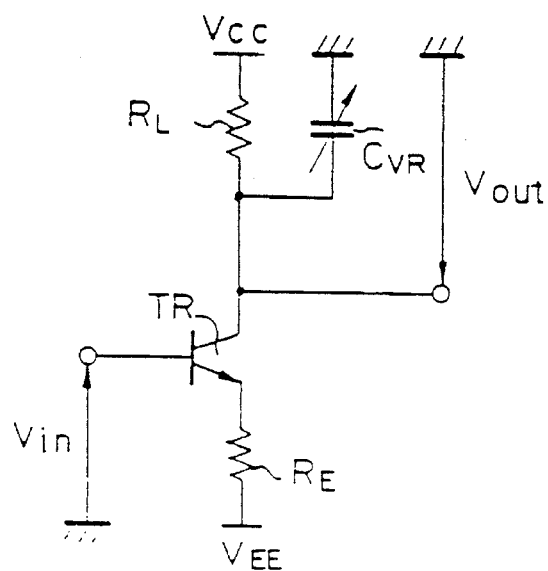
FIGS. 45 and 46 are circuit diagrams of prior art frequency band control and amplification circuits.
Figure 46:
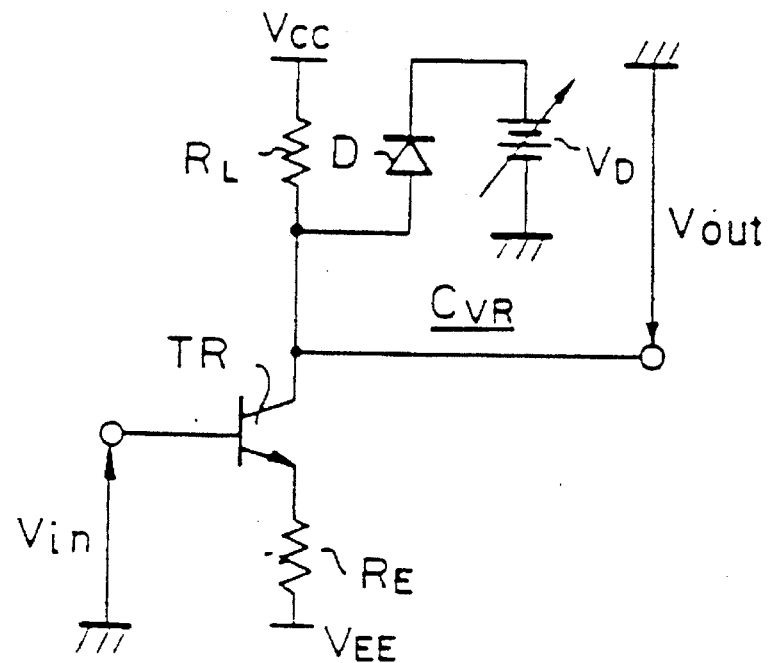
Figure 47:
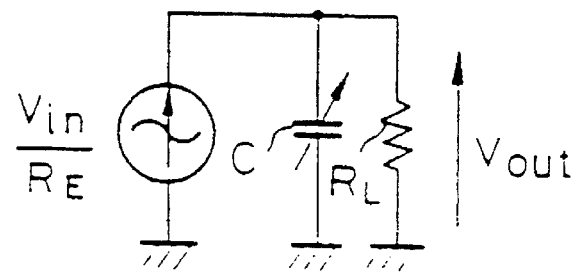
FIG. 47 is an equivalent circuit of the frequency band control and amplification circuits shown in FIGS. 45 and 46.
Figure 48:
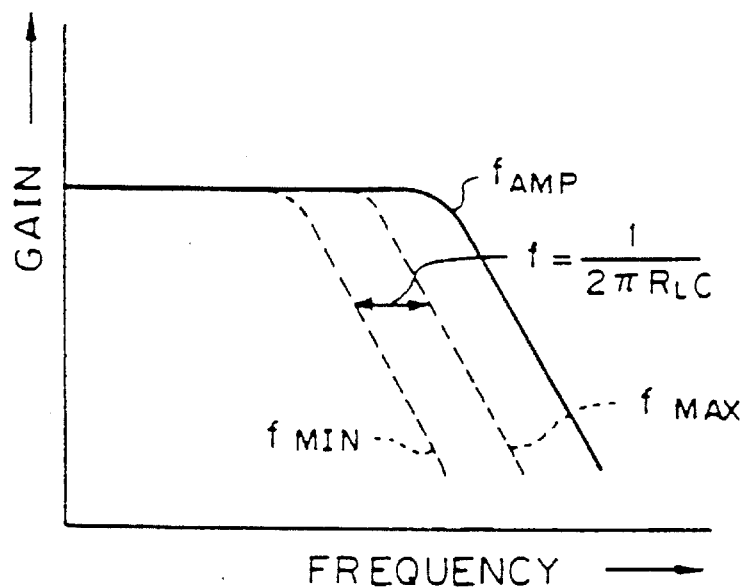
FIG. 48 is a graph representing a frequency characteristic of the circuit shown in FIG. 47.

FIG. 45 shows an amplifier including a prior art frequency band control circuit. A resistor $R_E$ is connected to an emitter of a transistor, and a load resistor $R_L$ is connected to a collector. Furthermore, a variable capacitor $C_{VR}$ is connected to the load resistor $R_L$ in parallel. Actually, the variable capacitor $C_{VR}$ is realized by a voltage controlled variable capacitance diode D and a variable voltage supply $V_D$, as shown in FIG. 46. FIG. 47 shows an equivalent circuit diagram of the amplifier having the frequency band control amplification circuit shown in FIGS. 45 and 46. FIG. 48 shows a graph of a frequency characteristic of the amplifier 2 having the frequency band control circuit. A variable capacitance range of the variable capacitor diode D is narrow and can not be adjusted to zero. Due to a limitation of an amplification of the transistor, the resistance of the load resistor $R_L$ can not be made small. Consequently, as shown in FIG. 48, minimum and maximum frequencies $f_{MIN}$ and $f_{MAX}$ are low and a control frequency band between the minimum and maximum frequencies $f_{MIN}$ and $f_{MAX}$ is narrow. The curve $f_{AMP}$ represents a maximum frequency band of the amplifier.

Figure 49:
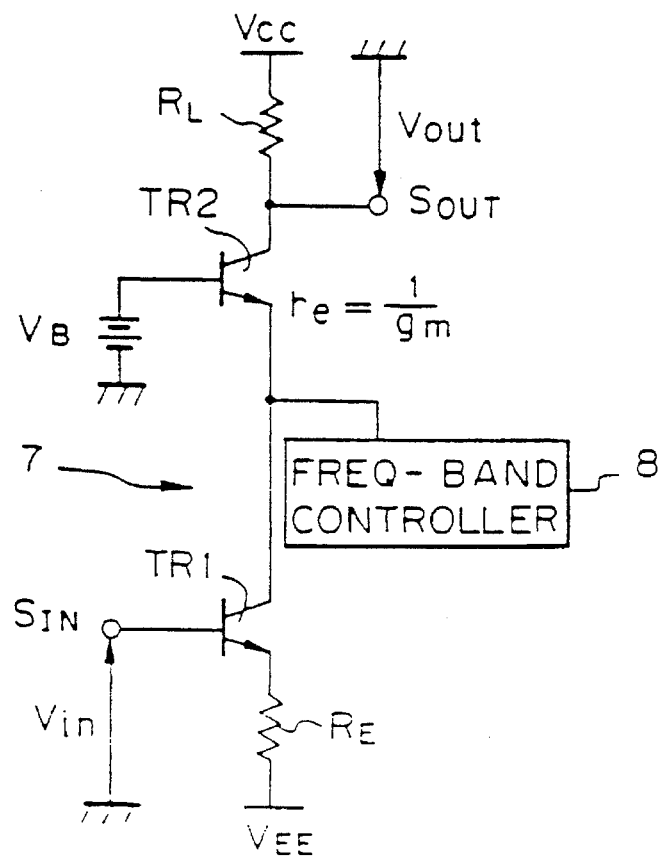
FIG. 49 is a circuit diagram showing the principle of a frequency band control and amplification circuit in accordance with the present invention.

FIG. 49 is a circuit diagram showing the principle of a frequency band control and amplification circuit of the present invention.

The frequency band control amplification circuit includes an amplification transistor TR1, a resistor $R_E$, a load transistor TR2, a load resistor $R_L$, a bias voltage supply $V_B$, and a frequency-band control portion 8. An emitter of the transistor TR1 is grounded through the resistor $R_E$, a collector of the transistor TR1 is connected to an emitter of the transistor TR2, and a base of the transistor TR2 is grounded through the bias voltage supply $V_B$. Accordingly, the frequency band control amplification circuit has a cascode circuit configuration 7. The load resistor $R_L$ is connected between a high voltage supply $V_{CC}$ and a collector of the transistor TR2. The transistor TR2 has an emitter resistance $r_e$ defined by $r_e=1/g_m$, where $g_m$ represents a mutual conductance of the transistor TR2. A base of the transistor TR1 receives an input signal $S_{IN}$ having a voltage $V_{IN}$, and an output signal $S_{OUT}$ having a voltage $V_{OUT}$, is output from a common connected point of the resistor $R_L$ and the collector of the transistor TR2. An amplitude of the output signal $S_{OUT}$ is varied in response to the voltage $V_{IN}$ of the input signal $S_{IN}$ and an amplification of the transistor TR1.

The frequency-band control portion 8 is connected to a common connected point of the collector of the transistor TR1 and the emitter of the transistor TR2. The frequency-band control portion 8 includes a variable capacitance component and/or means for changing the emitter resistance $r_e$ of the transistor TR2. This variable capacitance component functions as a stray capacitance discussed above. Note that this variable capacitance component is connected between the emitter of the transistor TR2 is ground, and not connected to the load resistor $R_L$ in parallel. Accordingly, a frequency band of the output signal $S_{OUT}$ is not directly effected by the variable capacitance component. The capacitance in question is substantially connected to the emitter resistor having a resistance $r_e$, of the transistor TR2, in parallel, and defines a frequency f of the transistor TR2 functioning as a current source for the load resistor $R_L$. In other words, in this invention, the variable capacitor corresponding to the stray capacitor is added to control the frequency band of the output signal $S_{OUT}$ by using the nature of the stray capacitance. Naturally, the bias current source BC is not provided in this invention. The frequency f is determined by the following formula:

$$f = \frac{1}{2\pi \cdot r_e \cdot C_V} \quad (13)$$

In addition to a change of the capacitance $C_V$, by changing the emitter resistance $r_e$ of the transistor TR2 through the frequency-band control portion 8, the above frequency f can be controlled. This is apparent from the formula (13).

Figure 50:
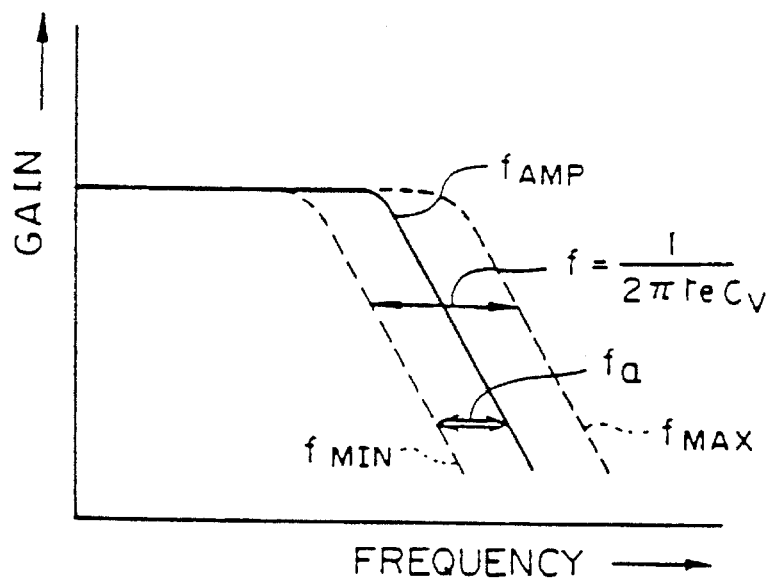
FIG. 50 is a graph representing a frequency characteristic of the frequency band control and amplification circuit shown in FIG. 49.

FIG. 50 shows a graph representing a frequency characteristic of the frequency band control amplification circuit shown in FIG. 49. The curve $f_{AMP}$ indicates a frequency characteristic of the cascode amplification circuit 7. The frequency band of the output signal $S_{OUT}$ controlled by the frequency band control amplification circuit shown in FIG. 49 is determined by a low frequency, either the above defined frequency f or a frequency on curve $f_{AMP}$. In the frequency band control amplification circuit, by controlling the capacitance $C_V$ of the frequency control portion 8 and/or the emitter resistance $r_e$, the frequency characteristic of the frequency f can be controlled. Supposing that the frequency range lies between $f_{MIN}$ and $f_{MAX}$, i.e., $f_{MIN} \leq f \leq f_{MAX}$, by selecting the capacitance $C_V$ and/or the emitter resistance $r_e$ to be $f_{MAX} > F_{AMP}$, the cascode circuit 7 can control the frequency band between $f_{MIN}$ and $f_{AMP}$, as shown in FIG. 50. In this way, the frequency band control amplification circuit shown in FIG. 49 can freely control the frequency band at a wide frequency range.

Figure 51:
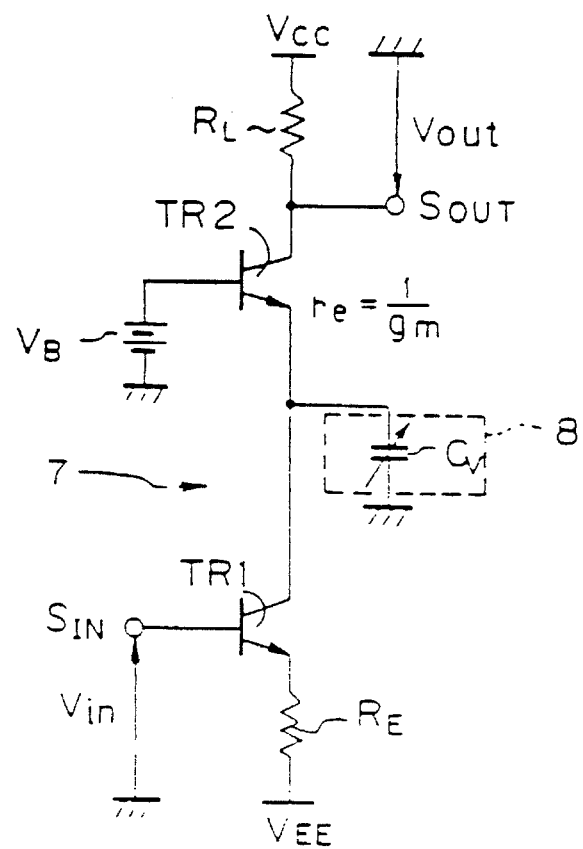
FIGS. 51, 52 and 53 are a circuit diagram, an equivalent circuit diagram, and a graph of a frequency characteristics, respectively of an embodiment of the present invention.
Figure 52:
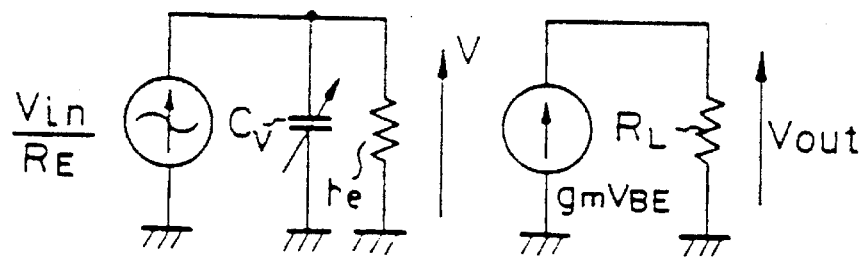

FIG. 51 shows a circuit diagram of a first embodiment of a frequency band control amplification circuit in accordance with the present invention. In the drawing, the frequency-band control portion 8 comprises only a variable capacitor $C_V$ connected between the emitter of the load transistor TR2 and ground. FIG. 52 shows an equivalent circuit of the frequency band control amplification circuit shown in FIG. 51. The transistor TR1 functions as a current drive source ID, discussed above, supplying a current defined by $V_{IN}R_E$, and the load transistor TR2 functions as a current source, which supplies a current defined by $g_m V_{BM}$, for the load resistor $R_L$.

Figure 53:
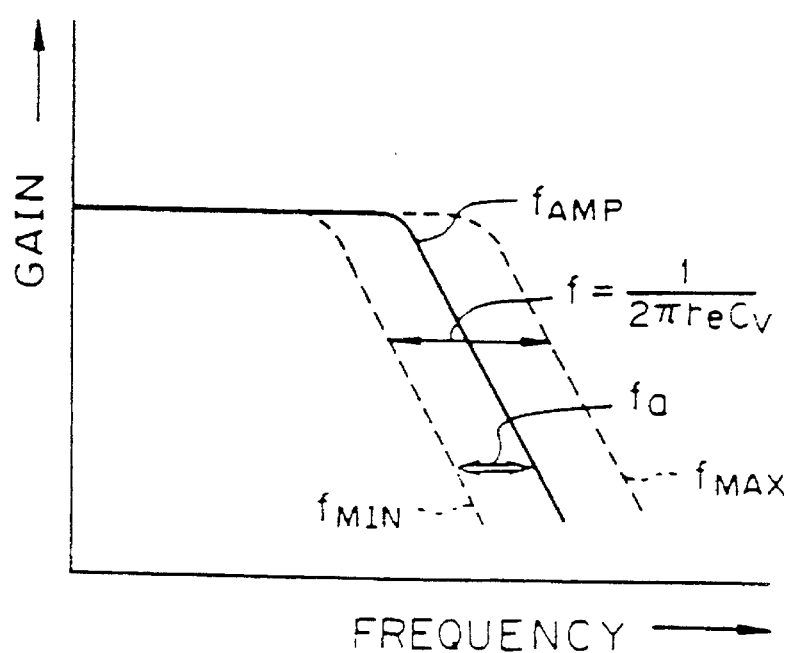

FIG. 53 shows a graph of a frequency characteristic of the frequency band control amplification circuit shown in FIG. 51. In the drawing, $f_a$ represents an actual controllable frequency range.

Figure 54:
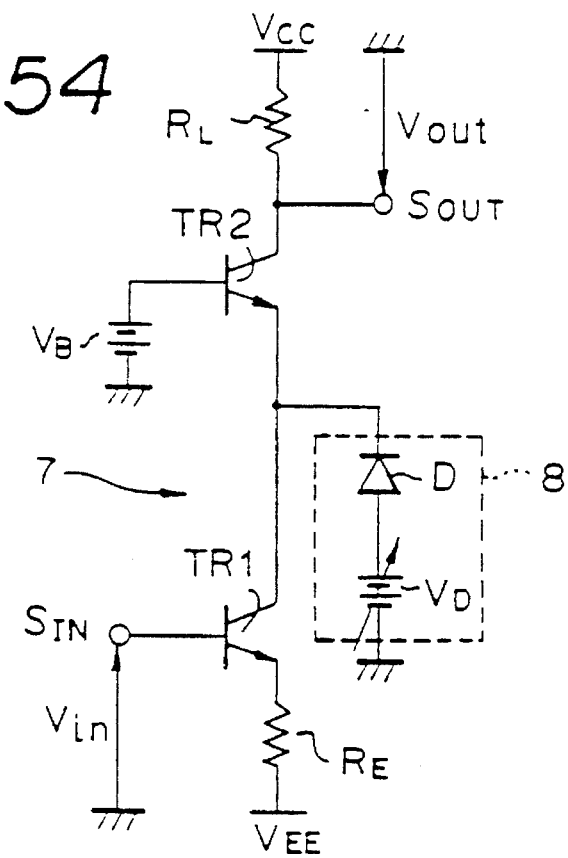
FIGS. 54 and 55 are circuit diagrams of modifications of the circuit shown in FIG. 51.

FIG. 54 shows a circuit diagram of a more specific frequency band control amplification circuit. In the drawing, the frequency-band control portion 8 comprises a voltage-controlled type variable capacitance diode D and a variable voltage supply $V_D$. The capacitance of this single ended variable capacitor circuit is controlled by changing a voltage of the variable voltage supply $V_D$.

Figure 55:
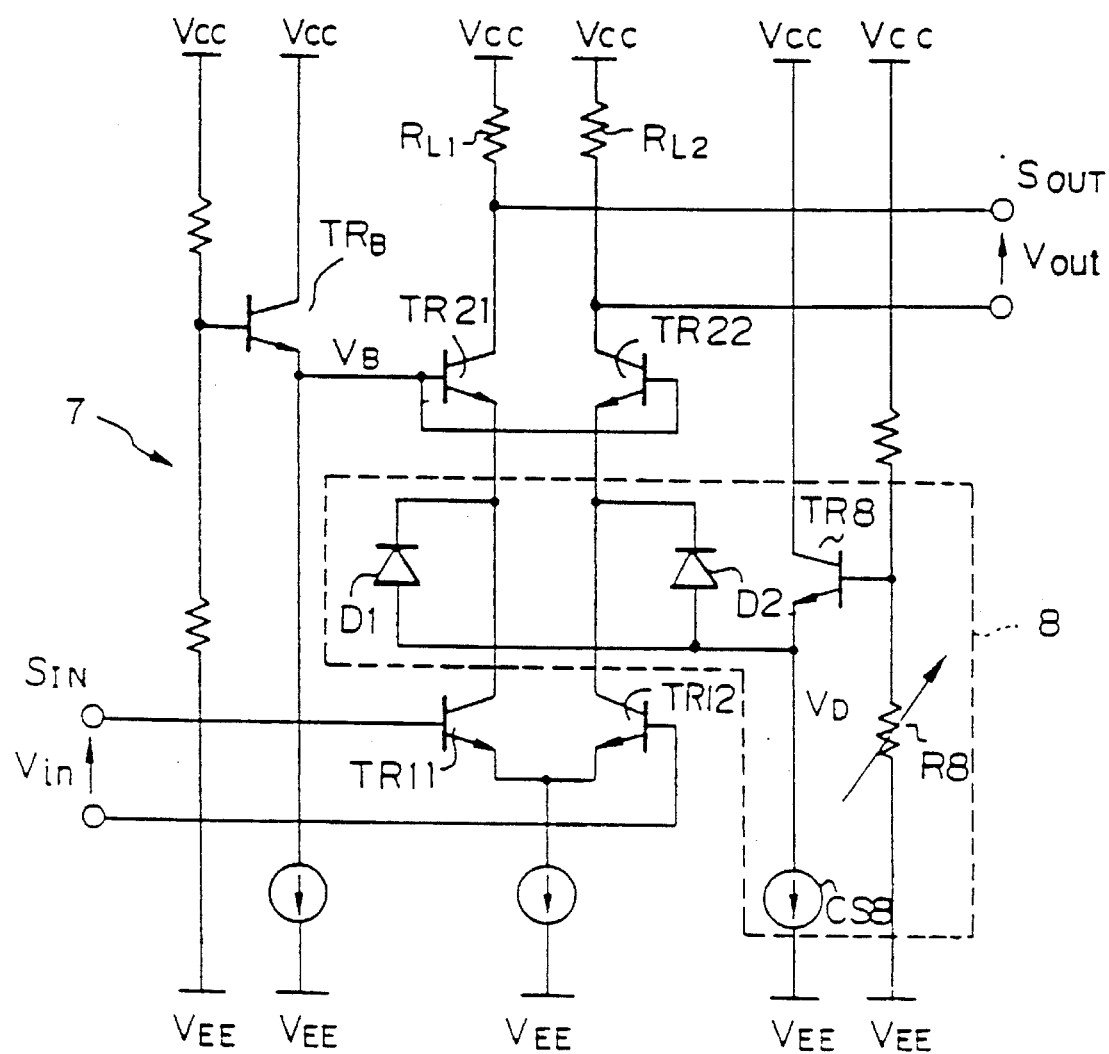

FIG. 55 shows a circuit diagram of another more specific frequency band control amplification circuit. In the drawing, the cascode circuit 7 is formed as a differential-operation type cascode circuit, and the frequency-band control portion 8 comprises two parallel-connected voltage-controlled type diodes D1 and D2, a current source CS8, a voltage control transistor TR8, and a variable resistor R8. The capacitances of the diodes D1 and D2 are controlled by changing the variable resistor R8. The bias voltage supply for supplying the bias voltage $V_B$ to bases of load transistors TR21 and TR22 is realized by a transistor $TR_B$.

Figure 56:
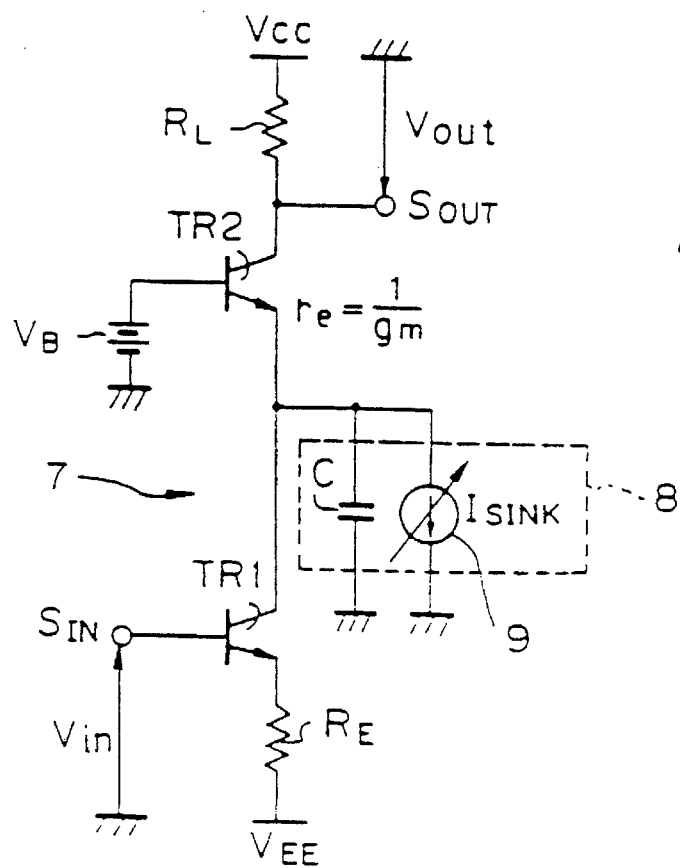
FIGS. 56, 57 and 58 are a circuit diagram, an equivalent circuit diagram, and a graph of a frequency characteristic, respectively of another embodiment of the present invention.

FIG. 56 shows a circuit diagram of a second embodiment of a frequency band control amplification circuit in accordance with the present invention. In the drawing, the frequency-band control portion 8 comprises a capacitor C and a variable DC current type current source 9. By changing a sink current $I_{SINK}$ ($=I_E$) flowing to the emitter of the load transistor TR2, the emitter resistance $r_e$ is changed in accordance with the following formula:

$$r_e = \frac{V_T}{I_E} \qquad (14)$$

where, $V_T$ represents a thermal voltage.

$$V_T = KT/q \qquad (15)$$

where,
K represents a Boltzmann constant,
T represents an absolute temperature, and
q represents a charge of an electron.

Figure 57:
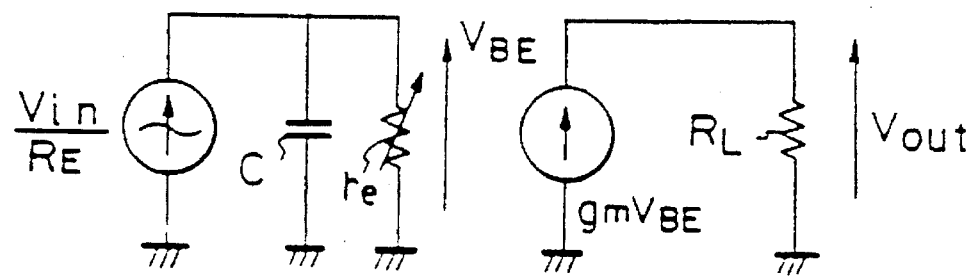
Figure 58:
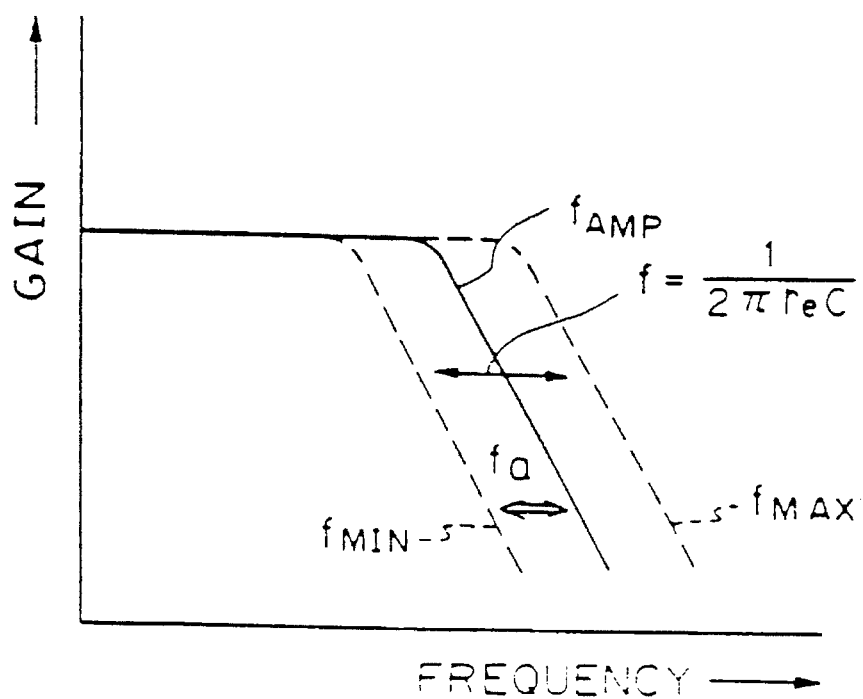

FIG. 57 shows a graph of an equivalent circuit of the frequency band control amplification circuit shown in FIG. 56. Namely, by changing the emitter resistance $r_e$ of the transistor TR2, which is a parameter for determining the frequency f defined by the formula (13), the actual frequency band $f_a$ can be controlled as shown in FIG. 58.

Figure 59:
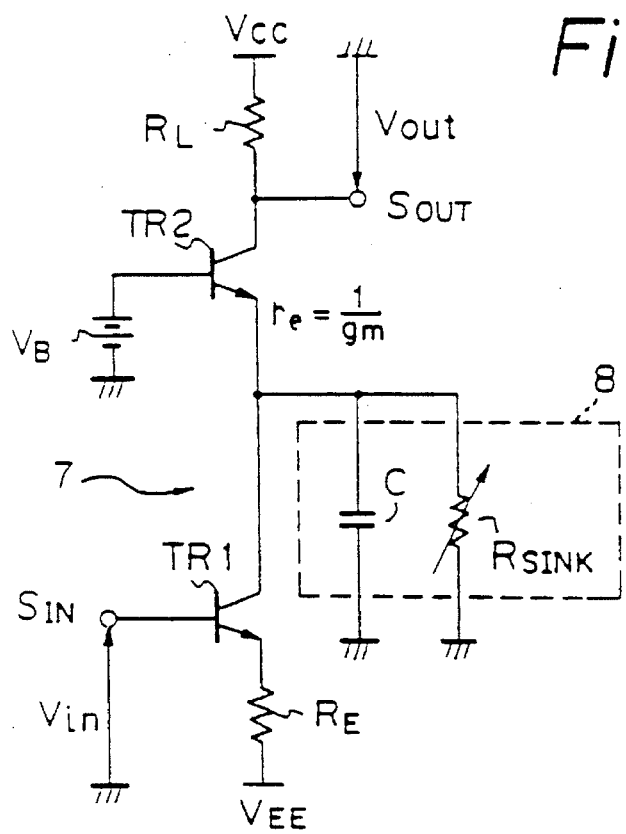
FIGS. 59 and 60 are circuit diagrams of modifications of the circuit shown in FIG. 56.
Figure 60:
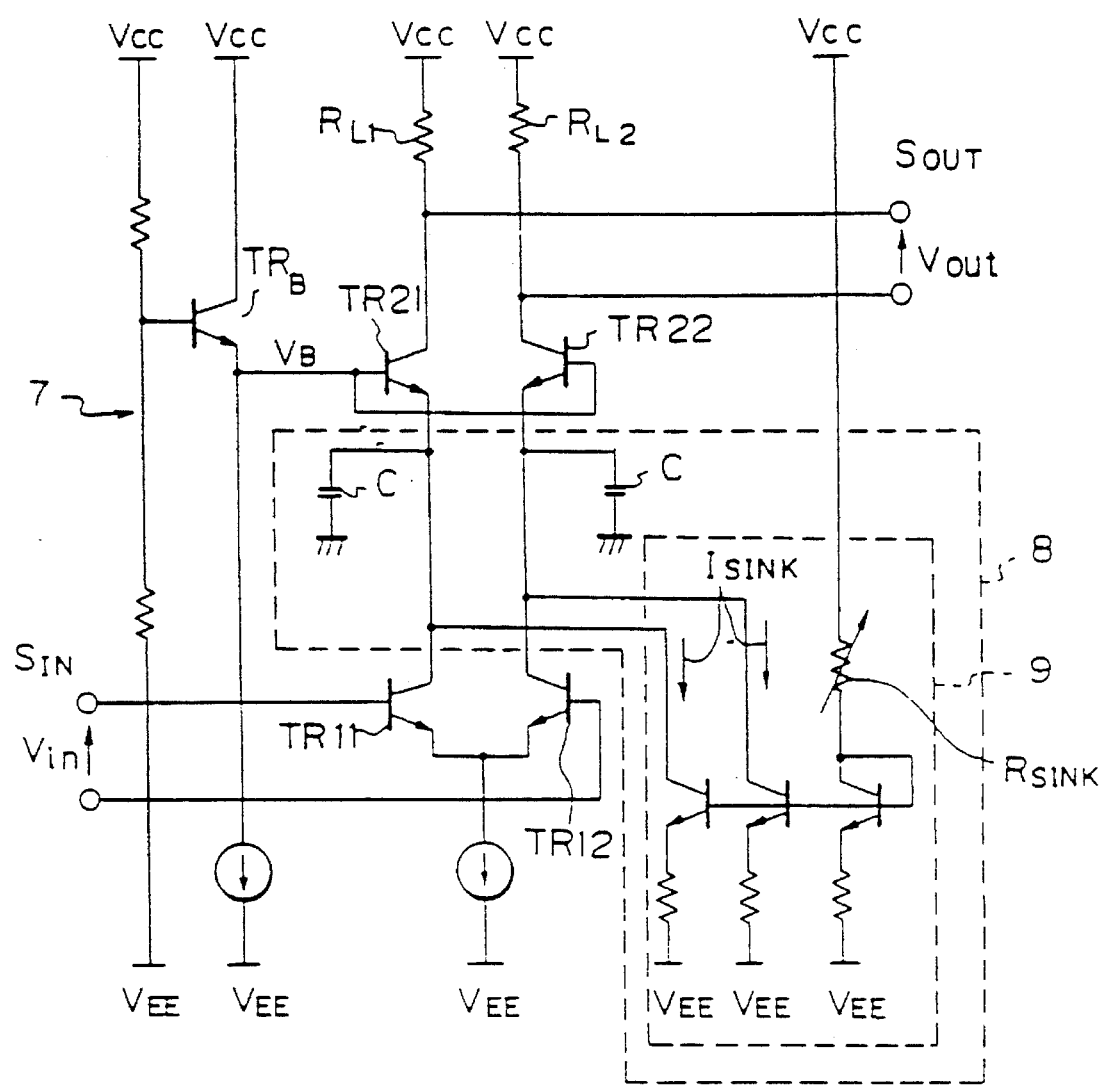

FIGS. 59 and 60 are circuit diagrams of more specific frequency band control amplification circuits. In FIG. 59, the variable DC current type current source 9 is a variable resistor $R_{SINK}$, and in FIG. 60, the variable DC current type current source 9 is a variable current-mirror type current source. By changing a variable resistor $R_{SINK}$ in the current source 9, sink currents $I_{SINK}$ flowing to the emitters of the load transistors TR21 and TR22 are changed, and emitter resistances $r_e$ of the load transistors TR21 and TR22 are changed.

Figure 61:
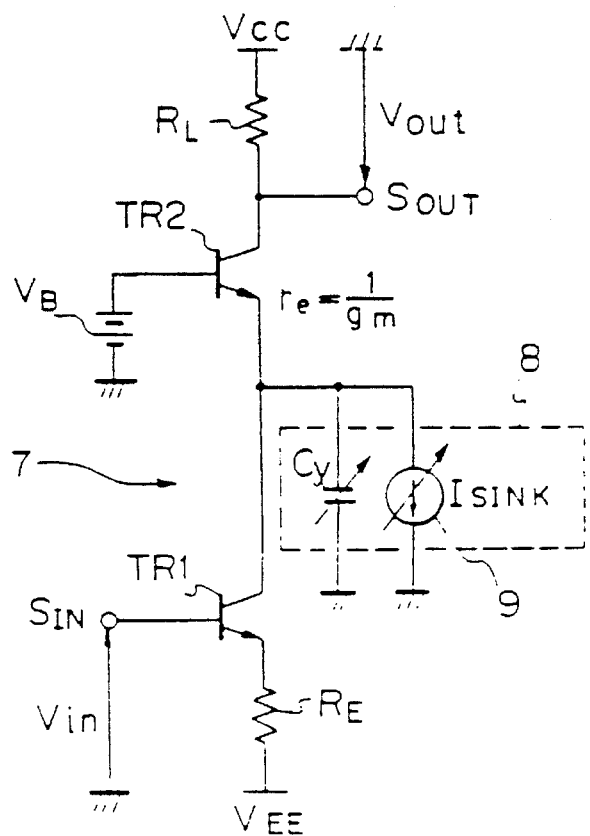
FIGS. 61, 62 and 63 are a circuit diagram, an equivalent circuit diagram, and a graph of a frequency characteristic of still another embodiment of a frequency band control signal respectively in accordance with circuit of the present invention.
Figure 62:
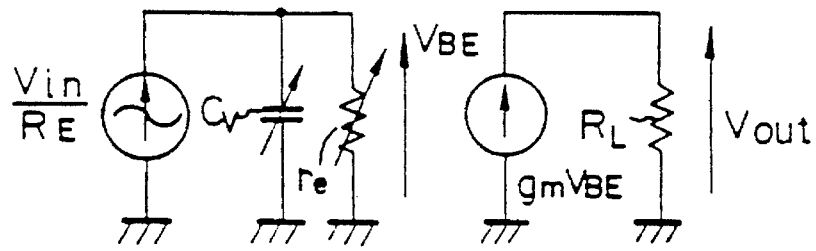
Figure 63:
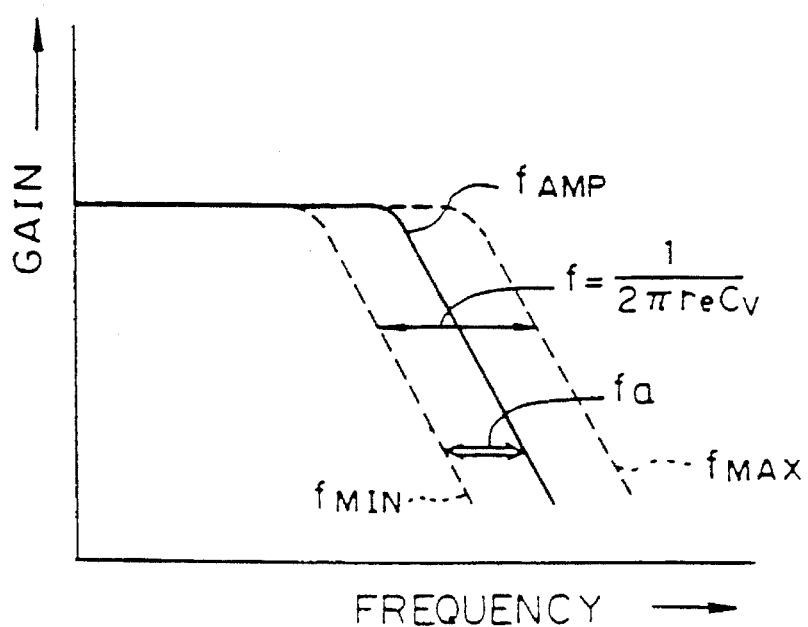

FIG. 61 shows a circuit diagram of a third embodiment of a frequency band control amplification circuit in accordance with the present invention. In the drawing, the frequency-band control portion 8 comprises a variable capacitor $C_V$ and a variable current source 9. This embodiment is a combination of the first and second embodiments described with reference to FIGS. 51 and 56. FIG. 62 is an equivalent circuit diagram of the frequency band control amplification circuit shown in FIG. 61. FIG. 63 shows a graph representing a frequency characteristic of the frequency band control amplification circuit shown in FIG. 61.

Figures 64, 66:
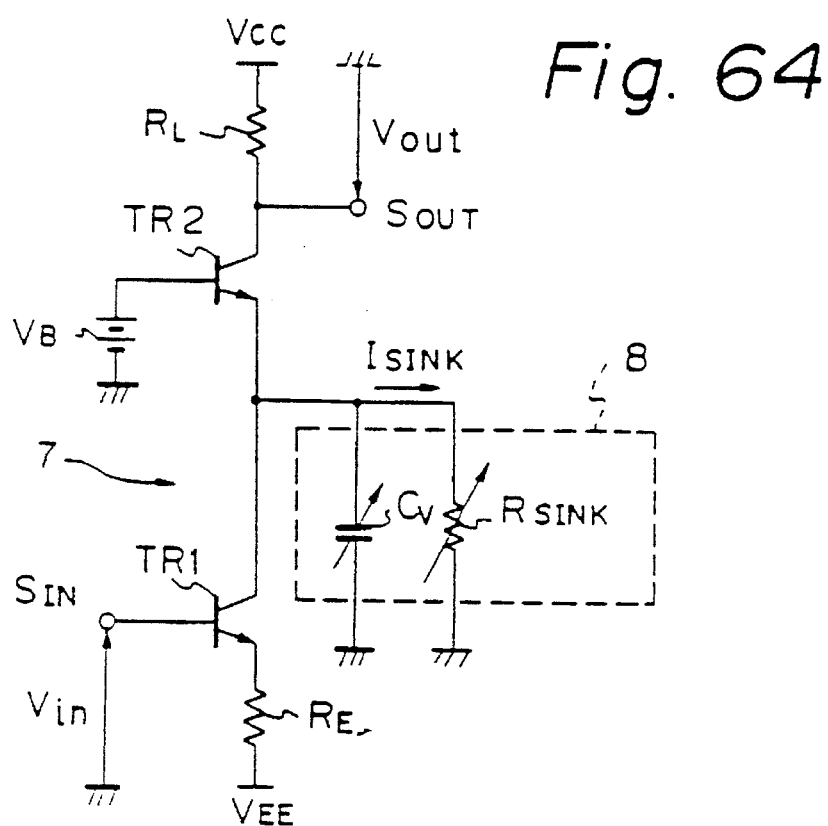
Figure 65:
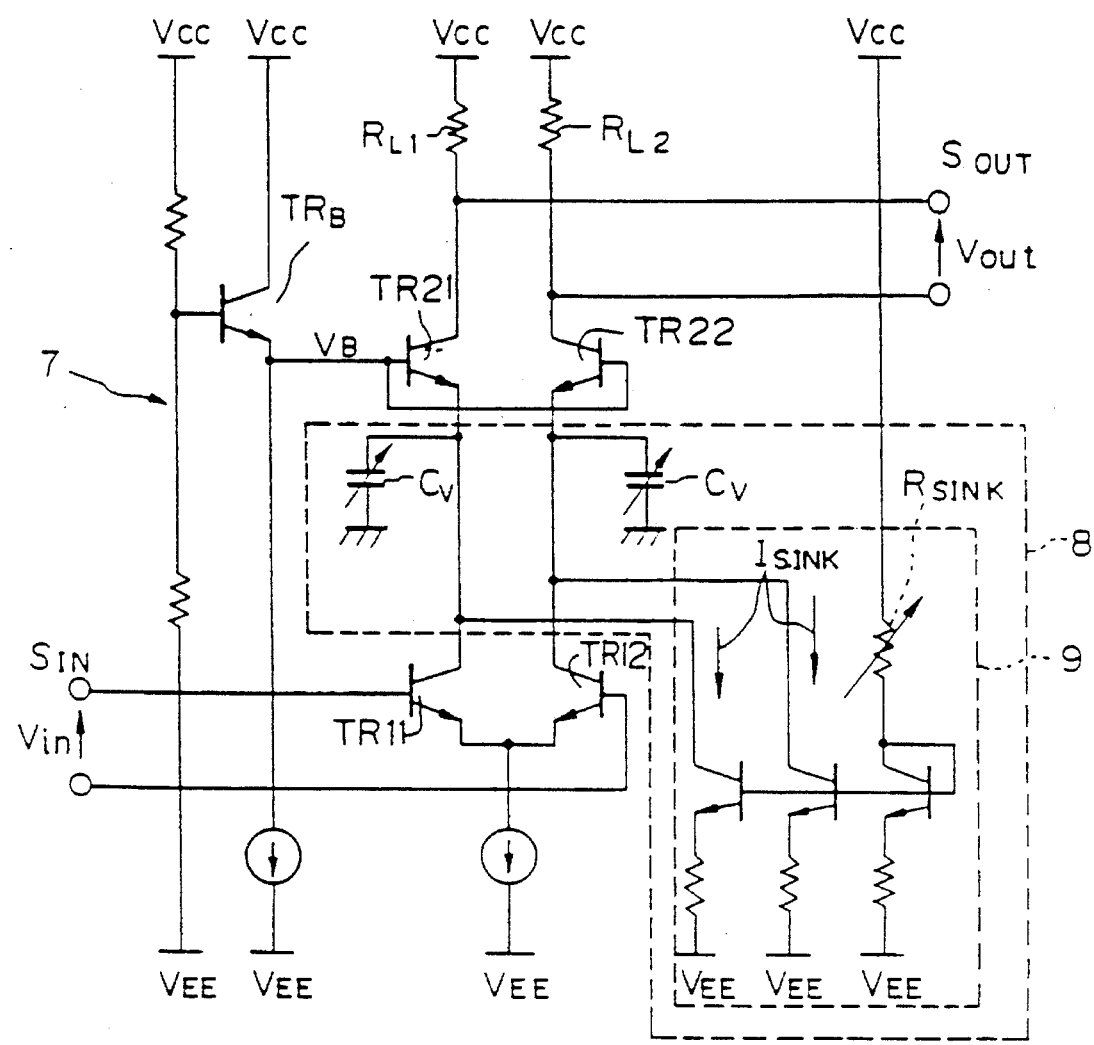

FIGS. 64 to 66 are circuit diagrams of more specific frequency band control amplification circuits of the third embodiment shown in FIG. 61. Circuit elements in the frequency-band control portions 8 in FIGS. 64 to 66 are a combination of the circuit elements described above.

Figure 67:
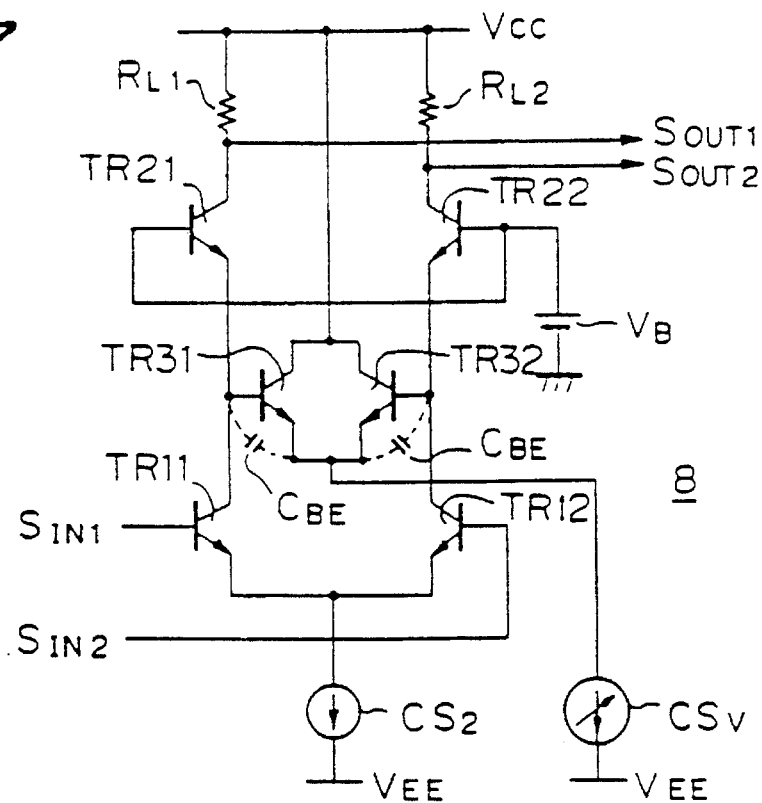
FIGS. 67 and 68 are circuit diagrams of yet other embodiments of a frequency band control and multiplication circuit in accordance with the present invention.

FIG. 67 shows a circuit diagram of a fourth embodiment of a frequency band control amplification circuit in accordance with the present invention. In the drawing, the frequency-band control portion 8 comprises parallel-connected transistors TR31 and TR32 and a variable current source $CS_V$. Base.emitter capacitors $C_{BE}$ of the transistors TR31 and TR32 are connected between the emitters of the transistors TR21 and TR22, the bases of which are grounded through the bias voltage supply $V_B$, and ground. The base-emitter capacitances $C_{BE}$ can be changed by changing currents through the transistors TR31 and TR32. The variable current source $CS_V$ is provided to supply the currents. Collectors of the transistors TR31 and TR32 are commonly connected to the high voltage supply $V_{CC}$.

Figure 68:
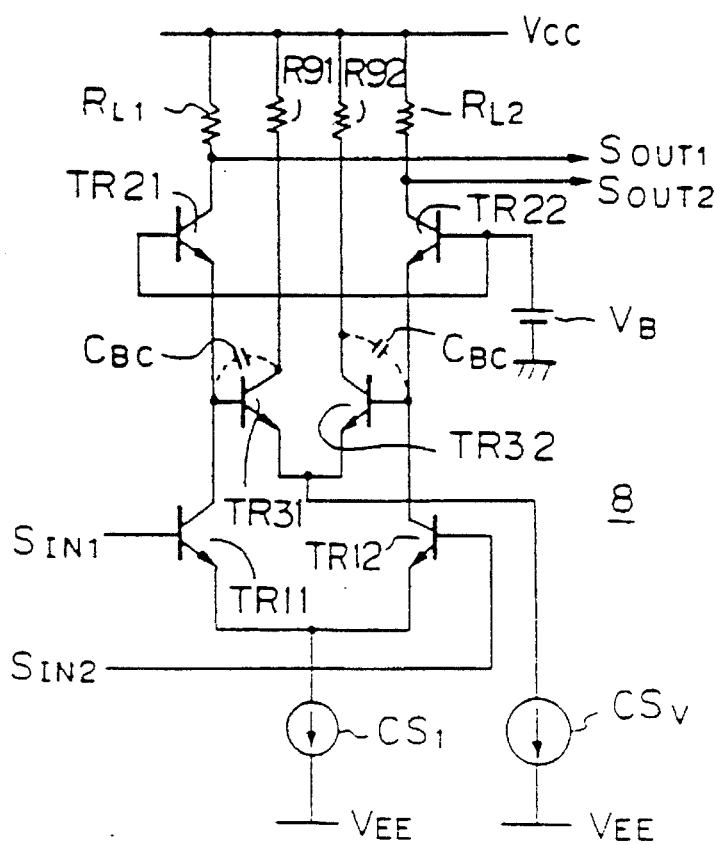

FIG. 68 shows a circuit diagram of a fifth embodiment of a frequency band control amplification circuit in accordance with the present invention. In the drawing, the frequency-band control portion 8 comprises parallel-connected transistors TR31 and TR32, resistors R91 and R92 connected between collectors of the transistors TR31 and TR32 and the voltage supply $V_{CC}$, and a variable current source $CS_V$. Base-collector capacitors $C_{BC}$ of the transistors TR31 and TR32 are connected between the emitters of the transistors TR21 and TR22, the bases of which are grounded through the bias voltage supply $V_B$, and the voltage supply $V_{CC}$. The base.collector capacitances $C_{BC}$ can be changed by changing currents through the transistors TR31 and TR32. The variable current source $CS_V$ is provided to supply the currents.

Throughout the above description, it should be understood that a common circuit configuration of the present invention is the high speed electronic circuit having the cascode circuit configuration and an additional circuit(s), such as the bias current source for eliminating the stray capacitance, or the frequency-band control portion for adding the capacitance component or changing the emitter resistance of the load transistor in the cascode circuit, both varying the frequency band.

Many widely different embodiments of the present invention may be constructed without departing from the spirit and scope of the present invention. It should be understood that the present invention is not limited to the specific embodiments described in this specification, except as defined in the appended claims.

The high speed electronic circuit and many circuits, such as the interface circuit, the level shift circuit, which are applications of the high speed electronic circuit, can be applied to a variety of electronic circuit systems requiring a high speed operation with an improved frequency characteristic, wave form response characteristics, stability and/or a wide frequency band.

We claim:

1. A level shift circuit comprising:

a current drive circuit including at least one input transistor, each having an emitter connected to a first reference potential, having a collector and having a base receiving at least one input signal, said current drive circuit includes first and second input transistors connected in parallel to differentially operate in response to first and second input signals connected to the bases of the first and second input transistors and a current source connected between the emitters of said first and second input transistors and said first reference potential;

a load transistor circuit including at least one load transistor, each having a base connected to a reference potential, and an emitter connected to the collector of a corresponding one of said at least one input transistor, said load transistor circuit includes first and second load transistors, wherein the emitter of said first load transistor is connected to the collector of said first input transistor, the emitter of said second load transistor is connected to the collector of said second input transistor and the bases of said first and second load transistors are commonly connected and connected to a reference potential;

a bias current source connected between said emitter of said at least one load transistor and said first reference potential, a respective current generated by said bias current source being supplied to each of said at least one load transistor to maintain a forward base emitter voltage for each said at least one load transistor;

a load resistor circuit including at least one load resistor connected between the collector of a respective one of said at least one load transistor and a power supply voltage;

said bias current source further including a current mirror circuit connected to a control voltage source to shift the level of an output signal by a value defined by the control voltage source; and a plurality of said current drive circuits connected in parallel, wherein each of said current drive circuits receives said input signal to be synthesized, wherein said bias current source and said emitter of said load transistor in said load transistor circuit are connected to a common connection point of said parallel current drive circuits.

2. A level shift circuit comprising a current drive circuit including at least one input transistor, each having an emitter connected to a first reference potential, having a collector and having a base receiving at least one input signal, said current drive circuit includes first and second input transistors connected in parallel to differentially operate in response to first and second input signals connected to the bases of the first and second input transistors and a current source connected between the emitters of said first and second input transistors and said first reference potential;

- a load transistor circuit including at least one load transistor, each having a base connected to a reference potential, and an emitter connected to the collector of a corresponding one of said at least one input transistor, said load transistor circuit includes first and second load transistors, wherein the emitter of said first load transistor is connected to the collector of said first input transistor, the emitter of said second load transistor is connected to the collector of said second input transistor and the bases of said first and second load transistors are commonly connected and connected to a second reference potential:

a bias current source connected between said emitter of said at least one load transistor and said first reference potential, a respective current generated by said bias current source being supplied to each of said at least one load transistor to maintain a forward base emitter voltage for each said at least one load transistor;

a load resistor circuit including at least one load resistor connected between the collector of a respective one of said at least one load transistor and a power supply voltage;

said bias current source further including a current mirror circuit connected to a control voltage source to shift the level of an output signal by a value defined by the control voltage source, wherein:

said at least one load resistor includes first and second load resistors connected to the collectors of said first and second load transistors, respectively, to output first and second output signals from points at which the collectors and said first and second load resistors are commonly connected, said current-mirror circuit includes first, second and third current source transistors connected in parallel, wherein said first and second current source transistors have collectors which are respectively connected to the emitters of said first and second load transistors, said third current source transistor having a collector connected to the control voltage source, the collector of said third current source transistor being connected to a base thereof which is commonly connected to bases of said first and second current source transistors, and said current mirror circuit further includes second, third and fourth current source resistors respectively connected between emitters of said first, second and third current source transistors and ground, further comprising:

- a plurality of said current drive circuits connected in parallel, wherein each of said current drive circuits receives said input signal to be synthesized, wherein said bias current source and said emitter of said load transistor in said load transistor circuit are connected to a common connection point of said parallel current drive circuits.

3. A level shift circuit comprising:

a current drive circuit including at least one input transistor, each having an emitter connected to a first reference potential, having a collector and having a base receiving at least one input signal, said current drive circuit includes first and second input transistors connected in parallel to differentially operate in response to first and second input signals connected to the bases of the first and second input transistors and a current source connected between the emitters of said first and second input transistors and said first reference potential;

a load transistor circuit including at least one load transistor, each having a base connected to a reference potential, and an emitter connected to the collector of a corresponding one of said at least one input transistor, said load transistor circuit includes first and second load transistors, wherein the emitter of said first load transistor is connected to the collector of said first input transistor, the emitter of said second load transistor is connected to the collector of said second input transistor and the bases of said first and second load transistors are commonly connected and connected to a second reference potential;

a bias current source connected between said emitter of said at least one load transistor and said first reference potential, a respective current generated by said bias current source being supplied to each of said at least one load transistor to maintain a forward base emitter voltage for each said at least one load transistor, said bias current source further including a current mirror circuit connected to a control voltage source to shift the level of an output signal by a value defined by the control voltage source;

a load resistor circuit including at least one load resistor connected between the collector of a respective one of said at least one load transistor and a power supply voltage, said at least one load resistor including first and second load resistors connected to the collectors of said first and second load transistors, respectively, to output first and second output signals from points at which the collectors and said first and second load resistors are commonly connected; and a plurality of said current drive circuits connected in parallel, each of said current drive circuits receiving said input signal to be synthesized, said bias current source and said emitter of said load transistor in said load transistor circuit being connected to a common connection point of said parallel current drive circuits;

said current-mirror circuit including first, second and third current source transistors connected in parallel, said first and second current source transistors having collectors which are respectively connected to the emitters of said first and second load transistors, said third current source transistor having a collector connected to the control voltage source of said third current source transistor, having a base commonly connected to the base of said second current source transistor, and said current-mirror circuit further includes second, third and fourth current source resistors respectively connected between emitters of said first, second and third current source transistors and ground.

\* \* \* \* \*

UNITED STATES PATENT AND TRADEMARK OFFICE
CERTIFICATE OF CORRECTION

PATENT NO. : 5,510,745

DATED : APRIL 23, 1996

INVENTOR(S) : Hiroshi HAMANO, et al.

It is certified that error appears in the above-indentified patent and that said Letters Patent is hereby corrected as shown below:

TITLE PAGE [57] ABSTRACT, line 9, "an;" should be --an--.

Col. 5, line 61, "multiplication" should be --amplification--.

Col. 20, line 34, "$V_{IN}R_{E'}$" should be --$V_{IN}/R_{E'}$--.

Col. 22, line 49, "a reference" should be --a second reference--.

Signed and Sealed this

Second Day of July, 1996

Attest:

BRUCE LEHMAN

Attesting Officer

Commissioner of Patents and Trademarks